United States Patent
Su

(10) Patent No.: US 11,469,182 B2
(45) Date of Patent: Oct. 11, 2022

(54) SEMICONDUCTOR DEVICE STRUCTURE WITH MANGANESE-CONTAINING LINING LAYER AND METHOD FOR PREPARING THE SAME

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 1 day.

(21) Appl. No.: 17/093,977

(22) Filed: Nov. 10, 2020

(65) Prior Publication Data

US 2022/0148970 A1    May 12, 2022

(51) Int. Cl.
  *H01L 23/535* (2006.01)
  *H01L 23/532* (2006.01)
  *H01L 21/768* (2006.01)
  *H01L 27/108* (2006.01)

(52) U.S. Cl.
  CPC ........ *H01L 23/535* (2013.01); *H01L 21/7682* (2013.01); *H01L 21/76805* (2013.01); *H01L 21/76843* (2013.01); *H01L 21/76895* (2013.01); *H01L 23/5329* (2013.01); *H01L 23/53238* (2013.01); *H01L 27/10805* (2013.01)

(58) Field of Classification Search
  CPC ............. H01L 23/535; H01L 21/76805; H01L 21/7682; H01L 21/76843; H01L 21/76895; H01L 23/53238; H01L 23/5329; H01L 27/10805
  See application file for complete search history.

(56) References Cited

U.S. PATENT DOCUMENTS

| | | | | |
|---|---|---|---|---|
| 5,739,579 | A * | 4/1998 | Chiang | H01L 23/5329 257/E21.585 |
| 2010/0120250 | A1* | 5/2010 | Amanokura | C09K 3/1463 438/693 |
| 2011/0057317 | A1* | 3/2011 | Koike | H01L 21/76877 438/653 |
| 2014/0327141 | A1* | 11/2014 | Yu | H01L 21/76846 257/751 |
| 2016/0064321 | A1* | 3/2016 | Huang | H01L 21/76829 438/653 |
| 2019/0027450 | A1* | 1/2019 | Choi | H01L 23/3135 |
| 2019/0348368 | A1 | 11/2019 | Roy et al. | |
| 2020/0176380 | A1* | 6/2020 | Chen | H01L 23/5226 |

FOREIGN PATENT DOCUMENTS

TW    202038383 A    10/2020

* cited by examiner

*Primary Examiner* — Shahed Ahmed
*Assistant Examiner* — Vicki B. Booker
(74) *Attorney, Agent, or Firm* — Muncy, Geissler, Olds & Lowe, P.C.

(57) ABSTRACT

A semiconductor device structure includes a first conductive layer disposed over a semiconductor substrate, and a second conductive layer disposed over the first conductive layer. The semiconductor device structure also includes a first conductive plug disposed between and electrically connecting the first conductive layer and the second conductive layer. The first conductive plug includes copper. The semiconductor device structure further includes a first lining layer surrounding the first conductive plug. The first lining layer includes manganese.

11 Claims, 28 Drawing Sheets

SEMICONDUCTOR DEVICE STRUCTURE WITH MANGANESE-CONTAINING LINING LAYER AND METHOD FOR PREPARING THE SAME

TECHNICAL FIELD

The present disclosure relates to a semiconductor device structure and a method for preparing the same, and more particularly, to a semiconductor device structure with a manganese-containing lining layer and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as void formed in conductive structure, which results from the difficulties in filling a high aspect ratio opening. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first conductive layer disposed over a semiconductor substrate, and a second conductive layer disposed over the first conductive layer. The semiconductor device structure also includes a first conductive plug disposed between and electrically connecting the first conductive layer and the second conductive layer. The first conductive plug includes copper. The semiconductor device structure further includes a first lining layer surrounding the first conductive plug. The first lining layer includes manganese.

In an embodiment, the first conductive layer and the second conductive layer each include copper, and the first conductive plug further includes tungsten. In an embodiment, the first lining layer includes copper-manganese-silicon. In an embodiment, the semiconductor device structure further includes a first dielectric layer surrounding the first lining layer, wherein the first lining layer is separated from the first dielectric layer by an air gap. In an embodiment, the semiconductor device structure further includes a third conductive layer disposed over the second conductive layer, and a second conductive layer disposed between and electrically connecting the second conductive layer and the third conductive layer, wherein the second conductive plug includes copper. In addition, the semiconductor device structure includes a second lining layer surrounding the second conductive plug, wherein a portion of the second lining layer is sandwiched between the second conductive plug and the second conductive layer, and wherein the second lining layer includes manganese.

In an embodiment, the second lining layer includes a first sub-lining layer disposed over and directly contacting the second conductive layer, a second sub-lining layer disposed over the first sub-lining layer, and a third sub-lining layer disposed over the second sub-lining layer. The first sub-lining layer includes manganese silicon, the second sub-lining layer includes manganese, and the third sub-lining layer includes copper manganese. In an embodiment, the second lining layer includes copper-manganese-silicon.

In another embodiment of the present disclosure, a semiconductor device structure is provided. The semiconductor device structure includes a first conductive layer disposed over a semiconductor substrate, and a first dielectric layer disposed over the first conductive layer. The semiconductor device structure also includes a second conductive layer disposed over the first dielectric layer, a second dielectric layer disposed over the second conductive layer, and a third conductive layer disposed over the second dielectric layer. The semiconductor device structure further includes a first conductive plug penetrating through the first dielectric layer and electrically connecting the first conductive layer to the second conductive layer, and a first lining layer disposed between the first conductive plug and the first dielectric layer. The first conductive plug includes copper, and the first lining layer includes manganese. In addition, the semiconductor device structure includes a second conductive plug disposed in the second dielectric layer, and a second lining layer disposed between the second conductive plug and the second dielectric layer. The second conductive plug electrically connects the second conductive layer to the third conductive layer. The second conductive plug includes copper, and the second conductive plug includes copper.

In an embodiment, the first conductive plug and the second conductive plug each further includes tungsten. In an embodiment, the first conductive plug and the second conductive plug are disposed in a pattern-dense region, and an air gap is disposed between the first lining layer and the first dielectric layer. In an embodiment, the semiconductor device structure further includes a third conductive plug disposed in the second dielectric layer and in a pattern-loose region, wherein the third conductive plug electrically connects the second conductive layer to the third conductive layer, and the third conductive plug includes copper. In addition, the third conductive plug is separated from the second dielectric layer by the second lining layer, and a height of the third conductive plug is greater than a height of the second conductive plug.

In an embodiment, a width of the third conductive plug is greater than a width of the second conductive plug. In an embodiment, the semiconductor device structure further includes a first sub-lining layer disposed over and directly contacting the second conductive layer, and a second sub-lining layer disposed over the first sub-lining layer. The second sub-lining layer is in direct contact with the second conductive plug, the third conductive plug and the third conductive layer. The first sub-lining layer includes manganese or manganese silicon, and the second sub-lining layer includes copper manganese.

In yet another embodiment of the present disclosure, a method for preparing a semiconductor device structure is provided. The method includes forming a first conductive layer over a semiconductor substrate, and forming a first dielectric layer over the first conductive layer. The first conductive layer includes copper. The method also includes etching the first dielectric layer to form a first opening exposing the first conductive layer, and forming a first lining layer and a first conductive plug in the first opening. The first lining layer includes manganese, the first conductive plug includes copper, and the first conductive plug is surrounded by the first lining layer. The method further includes thrilling a second conductive layer over the first dielectric layer, the first lining layer and the first conductive layer. The second conductive layer includes copper.

In an embodiment, the method further includes forming an energy removable layer lining the first opening before the first lining layer and the first conductive plug are formed, wherein the first conductive layer is partially exposed after the energy removable layer is formed. In an embodiment, the method further includes performing a heat treatment process to transform the energy removable layer into an air gap after the second conductive layer is formed. In an embodiment, the method further includes forming a second dielectric layer over the second conductive layer, and etching the second dielectric layer to form a second opening exposing the second conductive layer. In addition, the method further includes forming a second lining layer and a second conductive plug in the second opening, and forming a third conductive layer to cover the second lining layer and the second conductive plug. The second conductive plug is surrounded by the second lining layer, the second lining layer includes manganese, and the second conductive plug includes copper.

In an embodiment, the first conductive plug and the second conductive plug each further include tungsten. In an embodiment, the third conductive layer is separated from the second dielectric layer by the second lining layer, and a portion of the second lining layer is sandwiched between the second conductive plug and the second conductive layer. In an embodiment, the forming of the second lining layer includes forming a first sub-lining layer over a top surface of the second dielectric layer, wherein sidewalls and a bottom surface of the second opening are covered by the first sub-lining layer, and wherein the first sub-lining layer includes manganese silicon. In addition, the forming of the second lining layer includes forming a second sub-lining layer over the first sub-lining layer, and forming a third sub-lining layer over the second sub-lining layer. The second sub-lining layer includes manganese, and the third sub-lining layer includes copper manganese.

Embodiments of a semiconductor device structure are provided in the disclosure. In some embodiments, the semiconductor device structure includes a conductive plug disposed between and electrically connecting two conductive layers in the vertical direction, and a lining layer surrounding the conductive plug. The conductive plug includes copper, and the lining layer includes manganese. The manganese-containing lining layer is configured to reduce or prevent voids from forming in the conductive plug, thereby decreasing the contact resistance of the conductive plug. As a result, the operation speed of the semiconductor device structure may be increased, which significantly improves the overall device performance.

The foregoing has outlined rather broadly the features and technical advantages of the present disclosure in order that the detailed description of the disclosure that follows may be better understood, Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
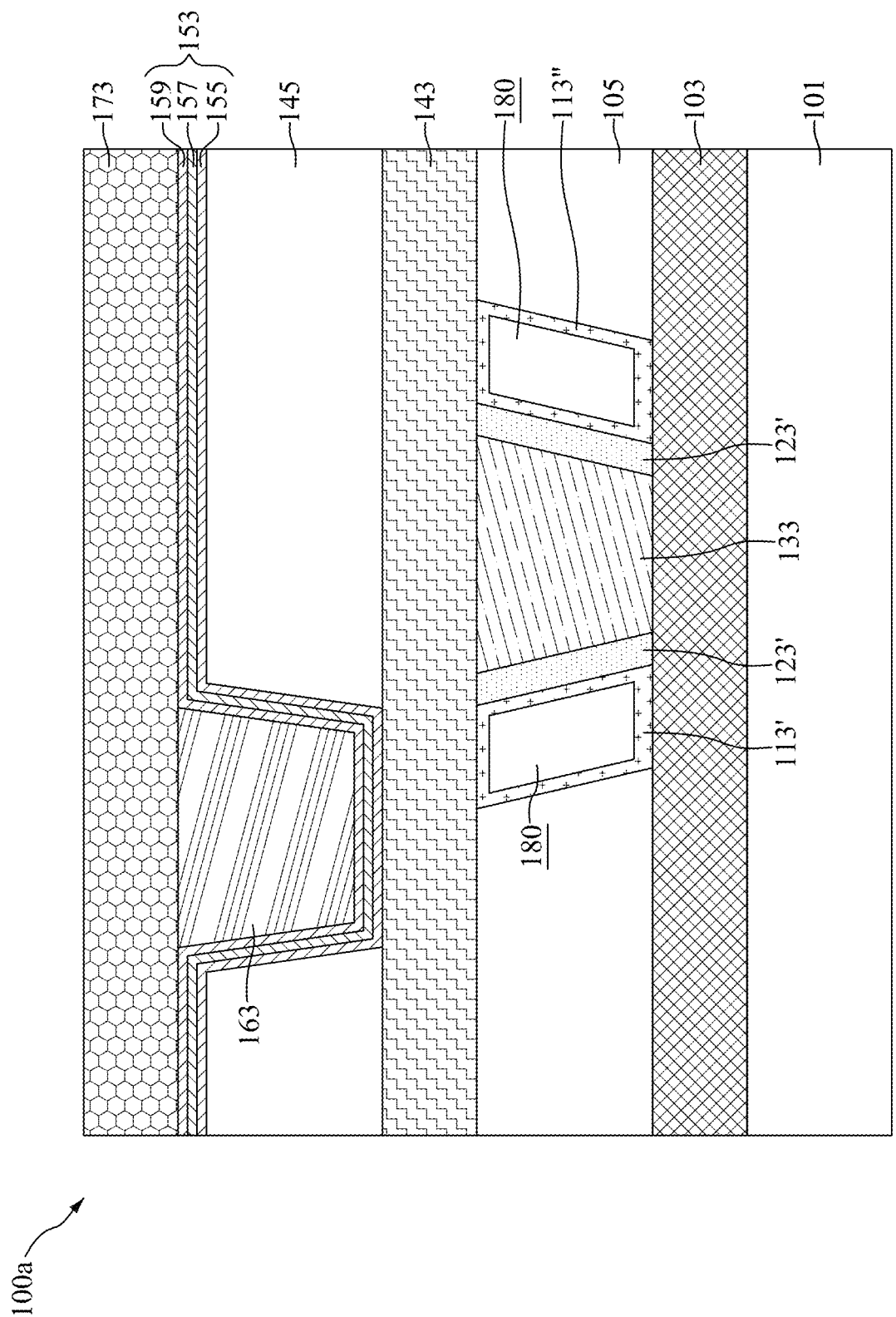
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100a, in accordance with some embodiments. The semiconductor device structure 100a includes a first conductive layer 103 disposed over a semiconductor substrate 101, a first dielectric layer 105 disposed over the first conductive layer 103, a second conductive layer 143 disposed over the first dielectric layer 105, a second dielectric layer 145 disposed over the second conductive layer 143, and a third conductive layer 173 disposed over the second dielectric layer 145, as shown in FIG. 1 in accordance with some embodiments.

The semiconductor device structure 100a also includes a lining layer 123' (also referred to as a first lining layer) and a conductive plug 133 (also referred to as a first conductive plug) disposed in the first dielectric layer 105. In some embodiments, the conductive plug 133 is surrounded by the lining layer 123', and the lining layer 123' is surrounded by the first dielectric layer 105. It should be noted that the first conductive layer 103 is electrically connected to the second conductive layer 143 by the conductive plug 133.

Moreover, the semiconductor device structure 100a includes an energy removable structure 113' disposed in the first dielectric layer 105 and between the lining layer 123' and the first dielectric layer 105. In some embodiments, an air gap 180 is enclosed by the energy removable structure 113'. In other words, the air gap 180 is disposed between the lining layer 123' and the first dielectric layer 105. In some embodiments, the lining layer 123' is surrounded by the energy removable structure 113' and the air gap 180. In some other embodiments, the energy removable structure 113' is not formed. In these cases, the lining layer 123' is separated from the first dielectric layer 105 by the air gap 180.

The semiconductor device structure 100a further includes a lining layer 153 (also referred to as a second lining layer) and a conductive plug 163 (also referred to as a second conductive plug) disposed between the second conductive layer 143 and the third conductive layer 173. In some embodiments, the conductive plug 163 is surrounded by the lining layer 153. It should be noted that the second conductive layer 143 is electrically connected to the third conductive layer 173 by the conductive plug 163 and the lining layer 153.

In some embodiments, the lining layer 153 is disposed between the second dielectric layer 145 and the third conductive layer 173, extending between the conductive plug 163 and the second dielectric layer 145 and between the conductive plug 163 and the second conductive layer 143. In some embodiments, the sidewalls and the bottom surface of the conductive plug 163 is covered by the lining layer 153. In some embodiments, a portion of the lining layer 153 is sandwiched between the conductive plug 163 and the second conductive layer 143.

In some embodiments, the lining layer 153 is a laminated multi-layer structure. As shown in FIG. 1, the lining layer 153 includes a first sub-lining layer 155, a second sub-lining layer 157 disposed over the first sub-lining layer 155, and a third sub-lining layer 159 disposed over the second sub-lining layer 157, in accordance with some embodiments. In some embodiments, the first sub-lining layer 155 is in direct contact with the second conductive layer 143 and the second dielectric layer 145. In some embodiments, the third sub-lining layer 159 is in direct contact with the conductive plug 163 and the third conductive layer 173.

In some embodiments, the semiconductor device 100a is a dynamic random access memory (DRAM). In these cases, the conductive layers (including the first conductive layer 103, the second conductive layer 143 and the third conductive layer 173) can serve as bit lines (BL), storage nodes and/or wiring layers for the DRAM, and the conductive plugs (including the conductive plugs 133 and 163) can serve as bit line contact plugs, capacitor contact plugs and/or interconnect structures for the DRAM.

In some embodiments, the first conductive layer 103, the second conductive layer 143, the third conductive layer 173, and the conductive plugs 133 and 163 each include copper (Cu), and the lining layers 123' and 153 each include manganese (Mn). In some other embodiments, the conductive plugs 133 and 163 each further include tungsten (W). In particular, the lining layers 123' includes copper-manganese-silicon (CuMnSi), the first sub-lining layer 155 of the lining layer 153 includes manganese silicon (MnSi), the second sub-lining layer 157 of the lining layer 153 includes manganese (Mn), and the third sub-lining layer 159 of the lining layer 153 includes copper manganese (CuMn), in accordance with some embodiments.

The manganese-containing lining layers 123' and 153 are configured to reduce or prevent voids from forming in the conductive plugs 133 and 163, thereby decreasing the contact resistance of the conductive plugs 133 and 163. As a result, the operation speed of the semiconductor device structure 100a may be increased, which significantly improves the overall device performance.

Figure 2:
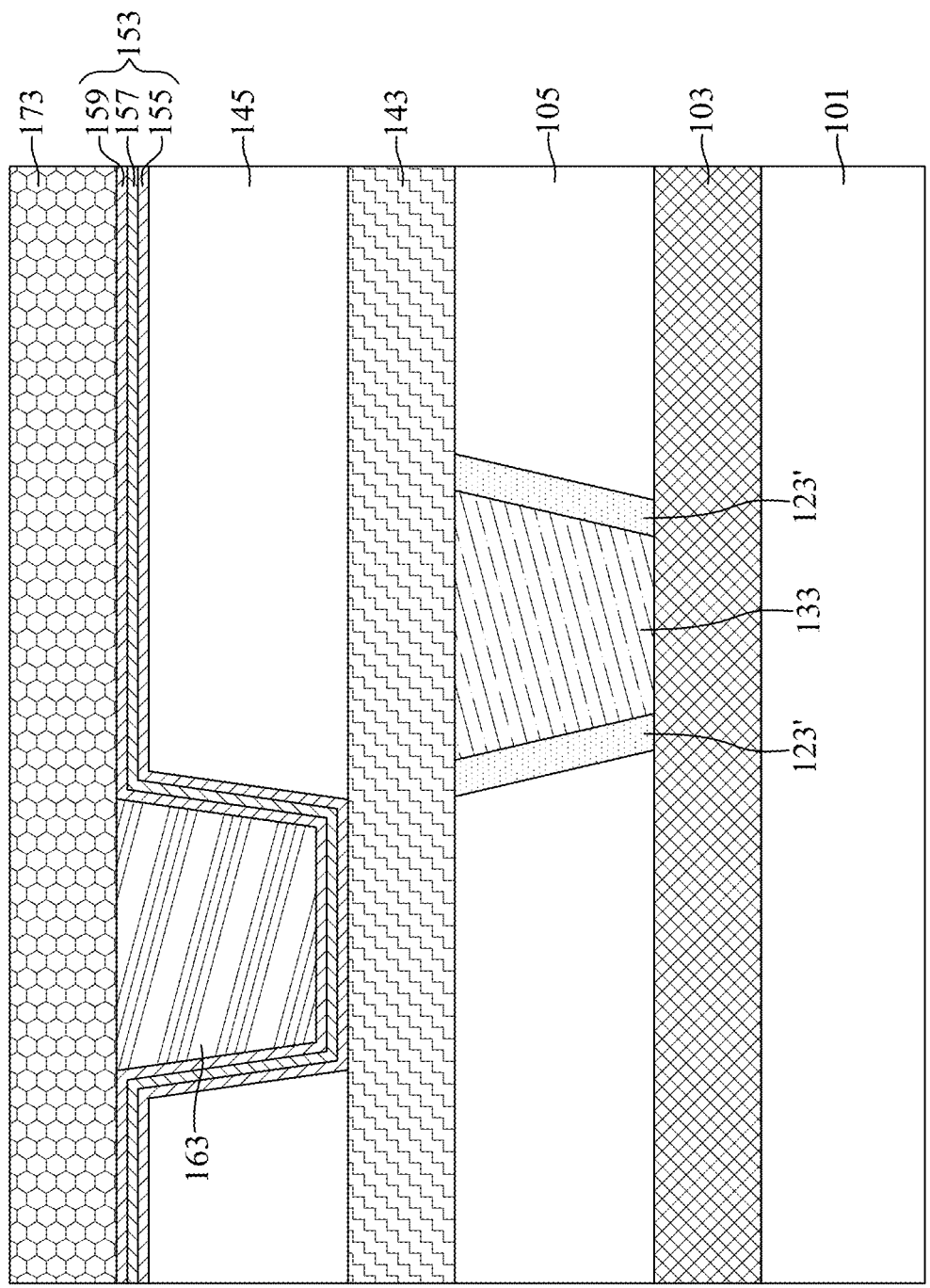
FIG. 2 is a cross-sectional view illustrating a modified semiconductor device structure, in accordance with some embodiments.

FIG. 2 is a cross-sectional view illustrating a modified semiconductor device structure 100b, which is an alternative embodiment of the semiconductor device structure 100a, in accordance with some embodiments. For reasons of consistency and clarity, similar components appearing in both FIGS. 1 and 2 will be labeled the same.

Similar to the semiconductor device structure 100a, the semiconductor device structure 100b includes the conductive plug 133 and the lining layer 123' disposed in the first dielectric layer 105, and the conductive plug 133 is surrounded by the lining layer 123'. A difference is that the energy removable structure 113" and the air gap 180 are not formed in the first dielectric layer 105 of the semiconductor device structure 100b. That is, the lining layer 123' is in direct contact with the first dielectric layer 105.

In addition, similar to the semiconductor device structure 100a, the manganese-containing lining layers 123' and 153 of the semiconductor device structure 100b are configured to reduce or prevent voids from forming in the conductive plugs 133 and 163, thereby decreasing the contact resistance of the conductive plugs 133 and 163. As a result, the operation speed of the semiconductor device structure 100b may be increased, which significantly improves the overall device performance.

Figure 3:
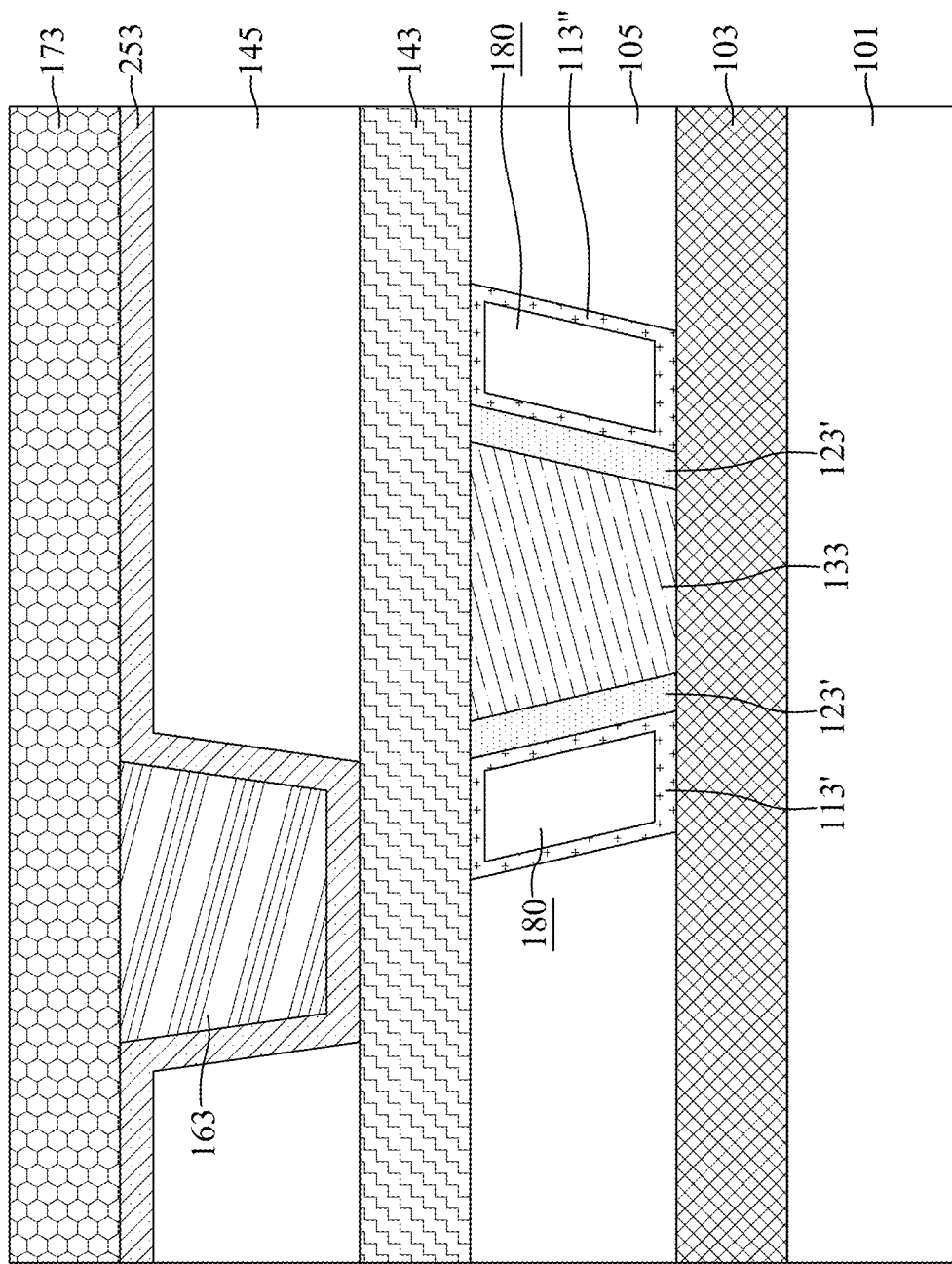
FIG. 3 is a cross-sectional view illustrating a modified semiconductor device structure, in accordance with some embodiments.

FIG. 3 is a cross-sectional view illustrating a modified semiconductor device structure 200a, which is an alternative embodiment of the semiconductor device structure 100a, in accordance with some embodiments. For reasons of consistency and clarity, similar components appearing in both FIGS. 1 and 3 will be labeled the same.

Similar to the semiconductor device structure 100a, the semiconductor device structure 200a includes a lining layer 253 (also referred to as a second lining layer) and the conductive plug 163 disposed between the second conductive layer 143 and the third conductive layer 173. A difference is that the lining layer 253 of the semiconductor device structure 200a is a single layer. In some embodiments, the lining layer 253 includes copper-manganese-silicon (CuMnSi).

In addition, similar to the semiconductor device structure 100a, the manganese-containing lining layers 123' and 253 of the semiconductor device structure 200a are configured to reduce or prevent voids from forming in the conductive plugs 133 and 163, thereby decreasing the contact resistance of the conductive plugs 133 and 163. As a result, the operation speed of the semiconductor device structure 200a may be increased, which significantly improves the overall device performance.

Figure 4:
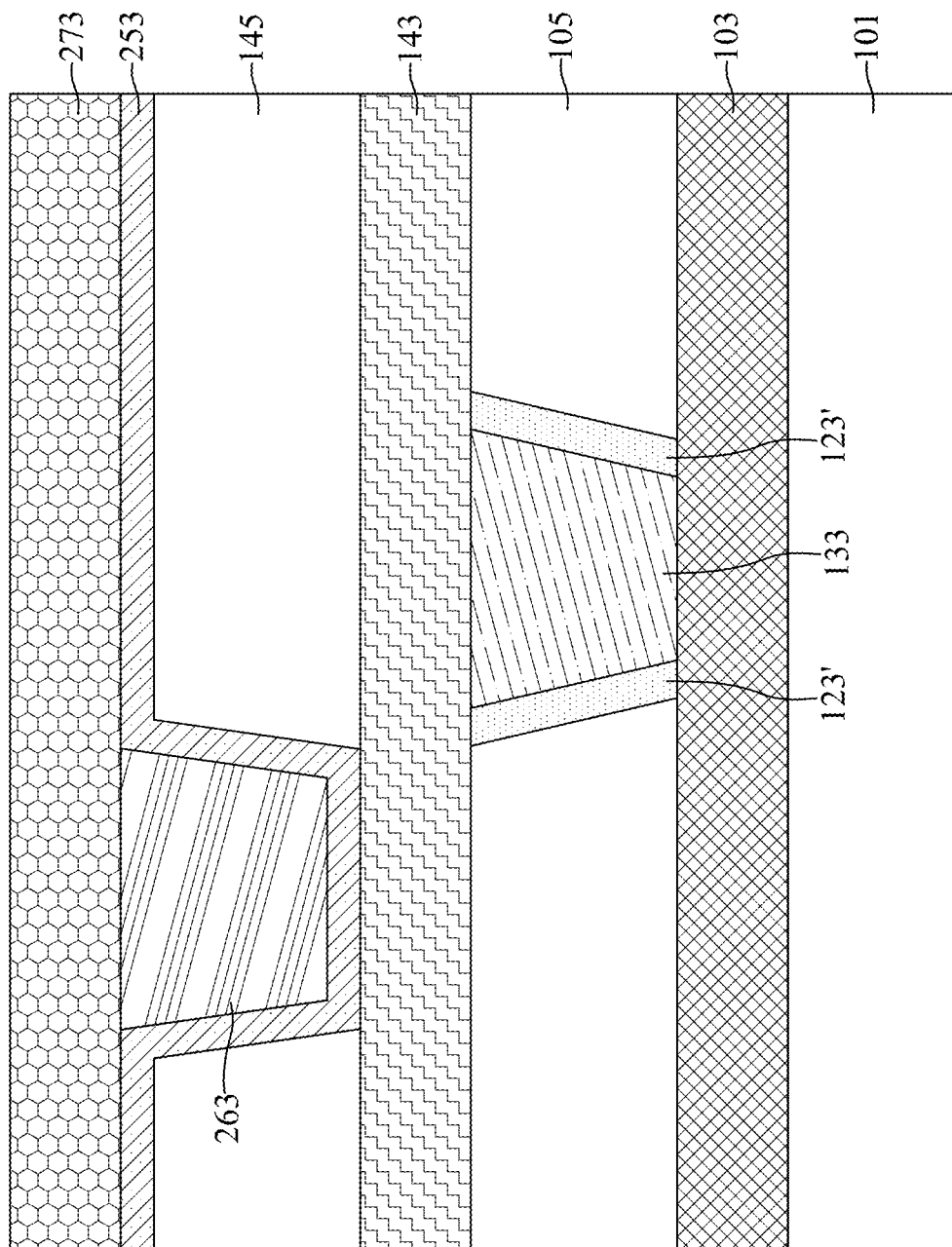
FIG. 4 is a cross-sectional view illustrating a modified semiconductor device structure, in accordance with some embodiments.

FIG. 4 is a cross-sectional view illustrating a modified semiconductor device structure 200b, which is an alternative embodiment of the semiconductor device structure 200a, in accordance with some embodiments. For reasons of consistency and clarity, similar components appearing in both FIGS. 3 and 4 will be labeled the same.

Similar to the semiconductor device structure 200a, the semiconductor device structure 200b includes the conductive plug 133 and the lining layer 123' disposed in the first dielectric layer 105, and the conductive plug 133 is surrounded by the lining layer 123'. A difference is that the energy removable structure 113" and the air gap 180 are not formed in the first dielectric layer 105 of the semiconductor device structure 200b. That is, the lining layer 123' is in direct contact with the first dielectric layer 105.

In addition, similar to the semiconductor device structure 200a, the manganese-containing lining layers 123' and 253 of the semiconductor device structure 200b are configured to reduce or prevent voids from forming in the conductive plugs 133 and 263, thereby decreasing the contact resistance of the conductive plugs 133 and 263. As a result, the operation speed of the semiconductor device structure 200b may be increased, which significantly improves the overall device performance.

Figure 5:
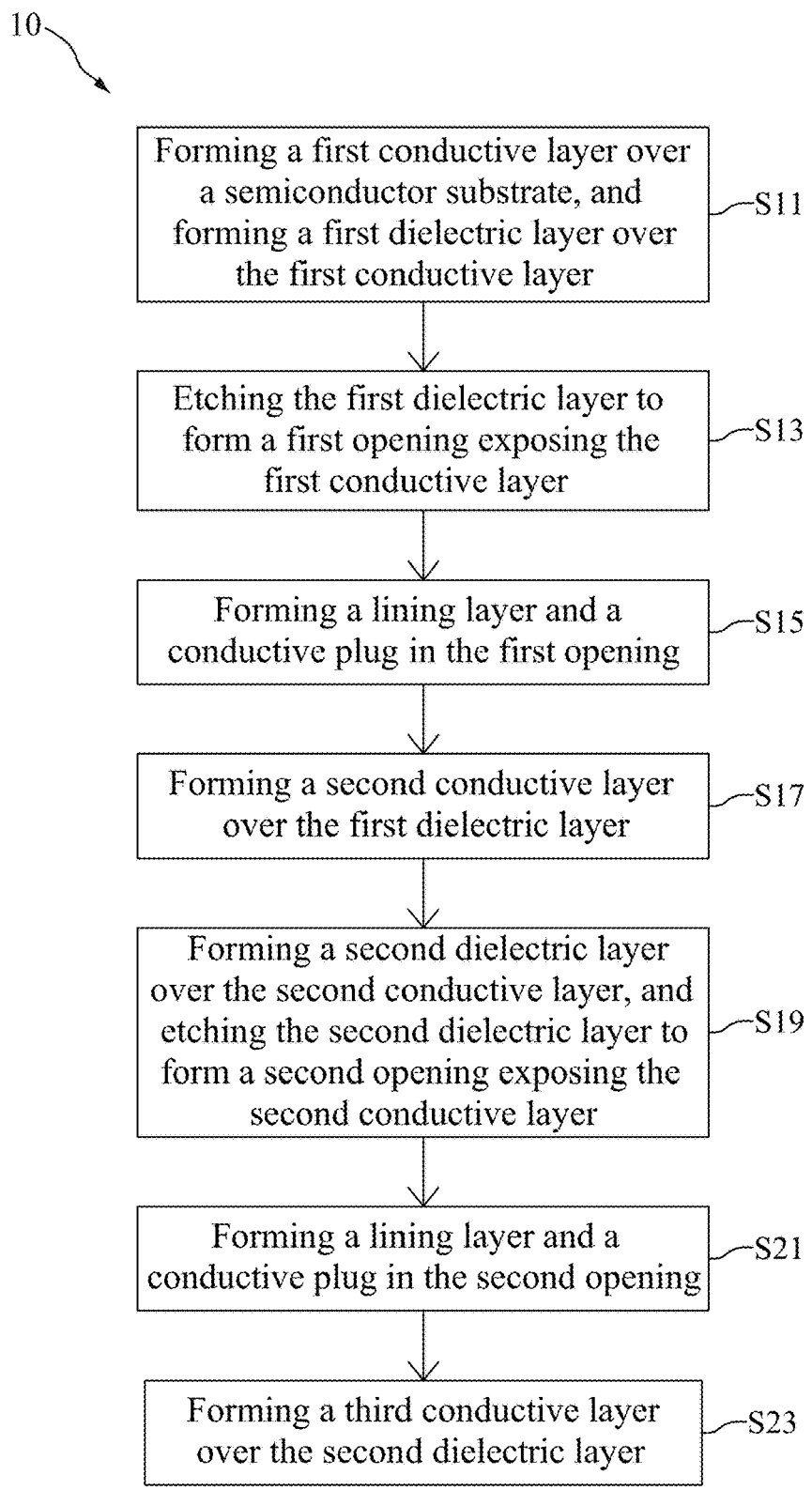
FIG. 5 is a flow diagram illustrating a method for preparing a semiconductor device structure, in accordance with some embodiments.

FIG. 5 is a flow diagram illustrating a method 10 of forming a semiconductor device structure (including the semiconductor device structure 100a and the modified semiconductor device structures 100b, 200a and 200b), and the method 10 includes steps S11, S13, S15, S17, S19, S21 and S23, in accordance with some embodiments. The steps S11 to S23 of FIG. 5 are elaborated in connection with the following figures.

Figure 6:
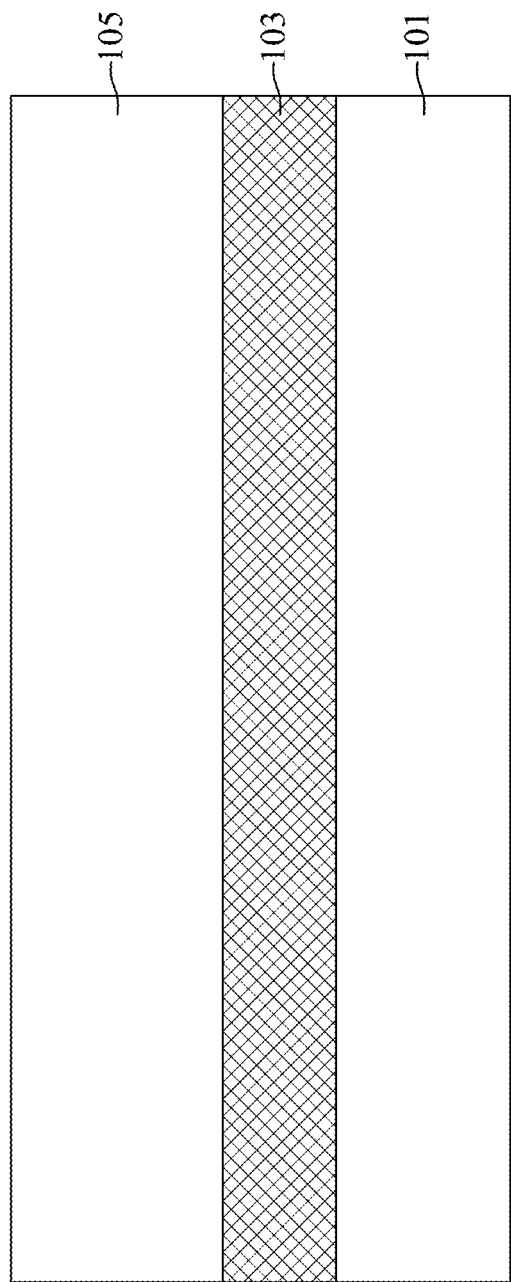
FIG. 6 is a cross-sectional view illustrating an intermediate stage of sequentially forming a first conductive layer and a first dielectric layer over a semiconductor substrate during the formation of the semiconductor device structure, in accordance with some embodiments.

FIGS. 6 to 17 are cross-sectional views illustrating intermediate stages of forming the semiconductor device structure 100a, in accordance with some embodiments. As shown in FIG. 6, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 6, the first conductive layer 103 is formed over the semiconductor substrate 101, and the first dielectric layer 105 is formed over the first conductive layer 103, in accordance with some embodiments. The respective step is illustrated as the step S11 in the method 10 shown in FIG. 5.

In some embodiments, the first conductive layer 103 includes copper (Cu), and the first conductive layer 103 is formed by a deposition process, such as a chemical vapor deposition (CVD) process, a physical vapor deposition (PVD) process, an atomic layer deposition (ALD) process, a metal organic chemical vapor deposition (MOCVD) process, a sputtering process, a plating process, or another applicable process. In some embodiments, the first dielectric layer 105 includes silicon oxide, silicon nitride, silicon oxynitride, or another applicable dielectric material, and the first dielectric layer 105 is formed by a deposition process, such as a CVD process, a PVD process, an ALD process, a spin-on coating process, or another applicable process.

Figure 7:
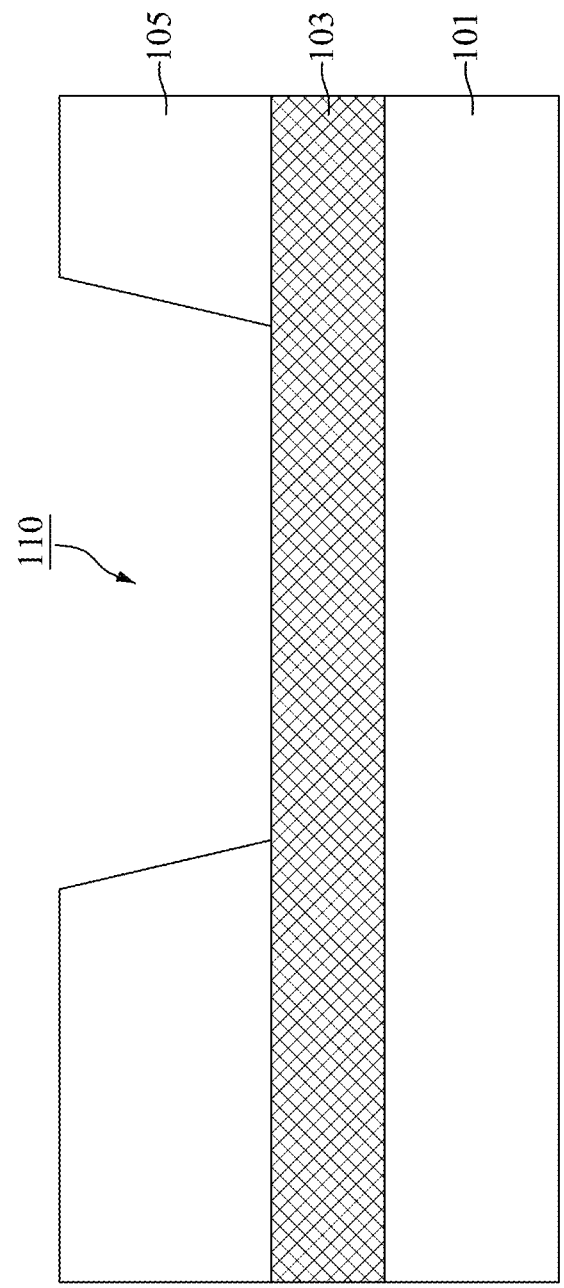
FIG. 7 is a cross-sectional view illustrating an intermediate stage of etching the first dielectric layer to expose a portion of the first conductive layer during the formation of the semiconductor device structure, in accordance with some embodiments.

Next, an etching process is performed on the first dielectric layer 105 to form a first opening 110 exposing the first conductive layer 103, as shown in FIG. 7 in accordance with some embodiments. The respective step is illustrated as the step S13 in the method 10 shown in FIG. 5. The formation of the first opening 110 may include forming a patterned mask (not shown) over the first dielectric layer 105, and etching the first dielectric layer 105 by using the patterned mask as a mask. In addition, the etching process for forming the first opening 110 may be a wet etching process, a dry etching process, or a combination thereof.

Figure 8:
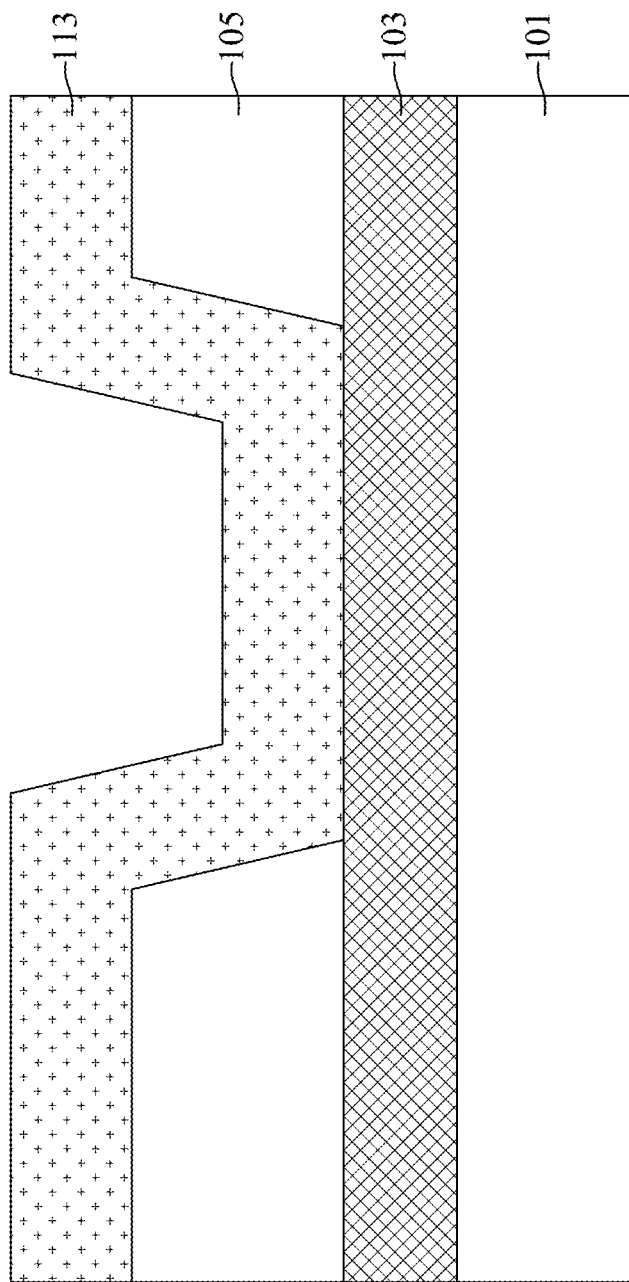
FIG. 8 is a cross-sectional view illustrating an intermediate stage of forming an energy removable material over the first dielectric layer during the formation of the semiconductor device structure, in accordance with some embodiments.
Figure 9:
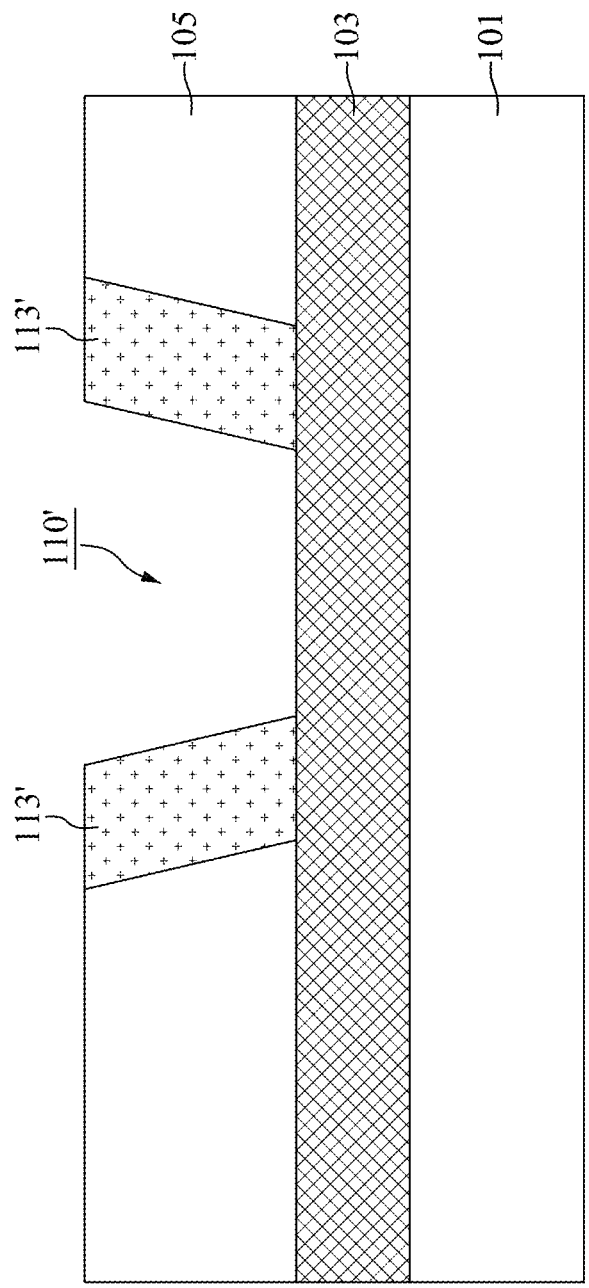
FIG. 9 is a cross-sectional view illustrating an intermediate stage of etching the energy removable material to form an energy removable layer in the first dielectric layer during the formation of the semiconductor device structure, in accordance with some embodiments.

Subsequently, an energy removable material 113 is conformally deposited over the first dielectric layer 105, as shown in FIG. 8 in accordance with some embodiments. In some embodiments, the sidewalls and the bottom surface of the first opening 110 are covered by the energy removable material 113. Then, an anisotropic etching process is performed on the energy removable material 113 to remove the same amount of the energy removable material 113 vertically in all places, leaving an energy removable layer 113' on the sidewalk of the first opening 110, as shown in FIG. 9 in accordance with some embodiments.

In some embodiments, the materials of the energy removable layer 113' include a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the energy removable layer 113' in the subsequent processes.

Moreover, the energy removable material 113 may be deposited by a CVD process, a PVD process, an ALD process, a spin-on coating process, or another applicable process. In addition, the anisotropic etching process performed on the energy removable material 113 may be a dry etching process. After the anisotropic etching process is performed, a remaining portion of the first opening 110' surrounded by the energy removable layer 113' is obtained, and the first conductive layer 103 is partially exposed by the remaining portion of the first opening 110', in accordance with some embodiments.

It should be noted that the formation of the energy removable layer 113' is optional. In some embodiments, the deposition process of the energy removable material 113 (FIG. 8) and the anisotropic etching process for forming the energy removable layer 113' (FIG. 9) are not performed. In these cases, the air gap 180 and the energy removable structure 113" are not formed, and the resulting structure may be similar to the semiconductor device structure 100b in FIG. 2 or the semiconductor device structure 200b in FIG. 4.

Figure 10:
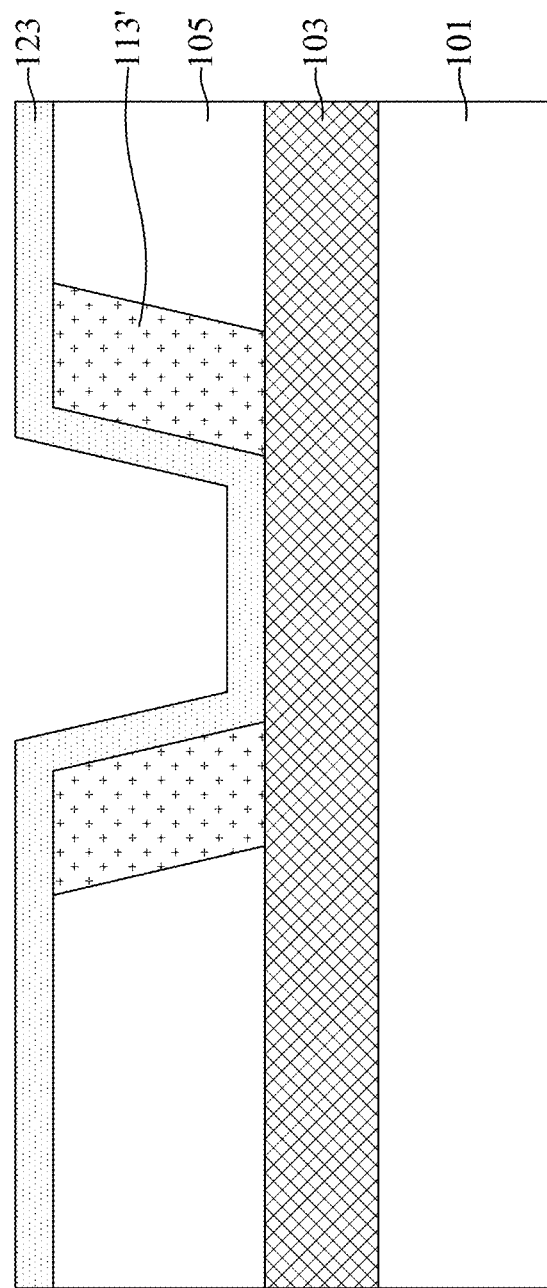
FIG. 10 is a cross-sectional view illustrating an intermediate stage of forming a lining material over the energy removable layer during the formation of the semiconductor device structure, in accordance with some embodiments.
Figure 11:
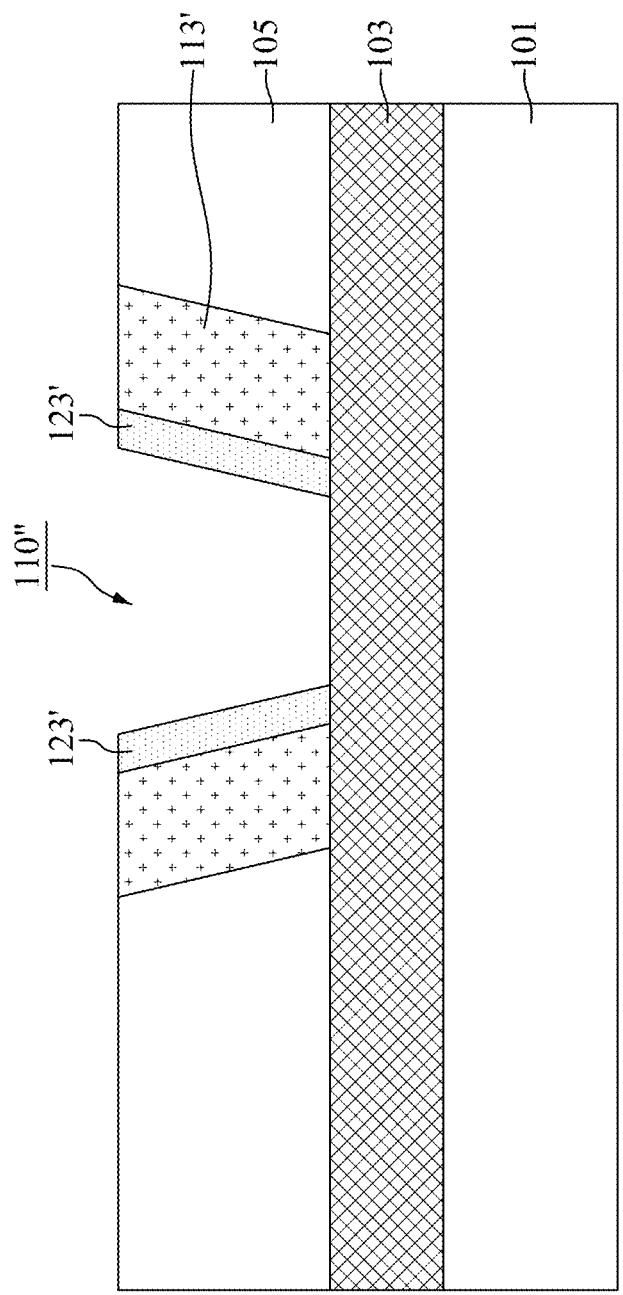
FIG. 11 is a cross-sectional view illustrating an intermediate stage of etching the lining material to form a lining layer in the first dielectric layer and surrounded by the energy removable layer during the formation of the semiconductor device structure, in accordance with some embodiments.

Next, a lining material 123 is conformally deposited over the first dielectric layer 105, as shown in FIG. 10 in accordance with some embodiments. In some embodiments, the sidewalls and the bottom surface of the remaining portion of the first opening 110' are covered by the lining material 123. Then, an anisotropic etching process is performed on the lining material 123 to remove the same amount of the lining material 123 vertically in all places, leaving the lining layer 123' on the sidewalls of the energy removable layer 113', as shown in FIG. 11 in accordance with some embodiments.

In some embodiments, the materials of the lining layer 123' include manganese (Mn), such as copper-manganese-silicon (CuMnSi). In some embodiments, the lining material 123 is deposited by a CVD process, a PVD process, an ALD process, a sputtering process, or another applicable process. In addition, the anisotropic etching process performed on the lining material 123 may be a dry etching process. After the anisotropic etching process is performed, a remaining portion of the first opening 110" surrounded by the lining layer 123' is obtained, and the first conductive layer 103 is partially exposed by the remaining portion of the first opening 110", in accordance with some embodiments.

Figure 12:
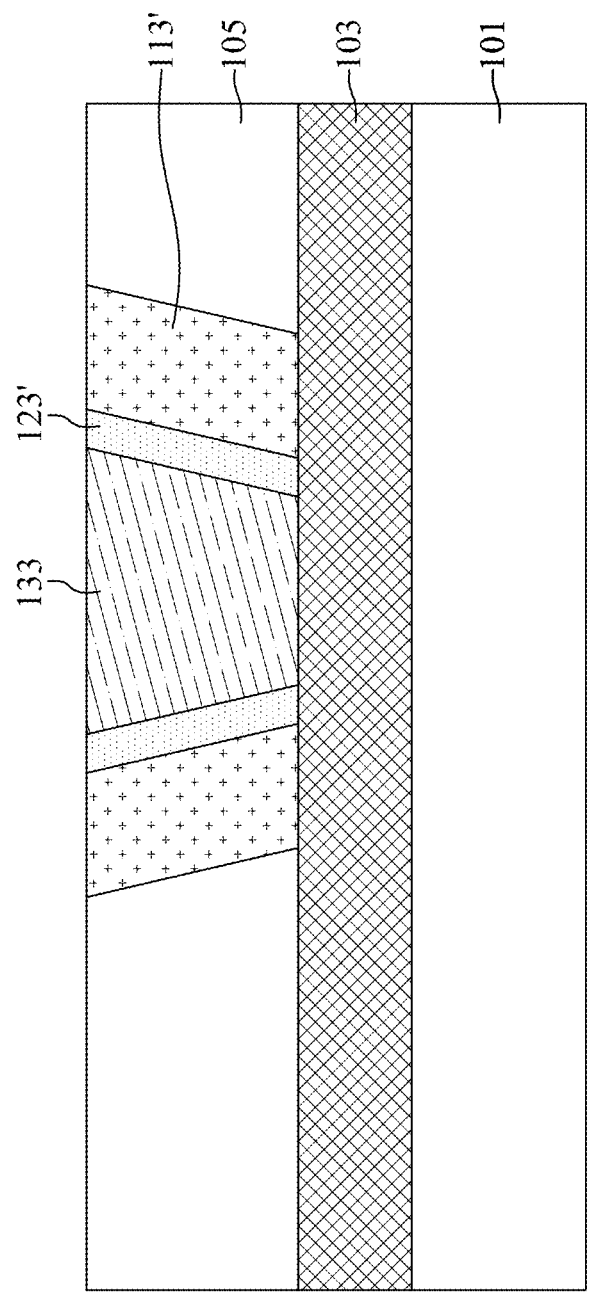
FIG. 12 is a cross-sectional view illustrating an intermediate stage of forming a conductive plug in the first dielectric layer and surrounded by the lining layer during the formation of the semiconductor device structure, in accordance with some embodiments.

After the lining layer 123' is formed, the conductive plug 133 is formed in the remaining portion of the first opening 110", as shown in FIG. 12 in accordance with some embodiments. The respective step is illustrated as the step S15 in the method 10 shown in FIG. 5. In some embodiments, the conductive plug 133 is surrounded by the lining layer 123'.

In some embodiments, the conductive plug 133 includes copper (Cu). In some embodiments, the conductive plug 133 includes copper (Cu) and tungsten (W). The formation of the conductive plug 133 may include conformally depositing a conductive material (not shown) over the first dielectric layer 105 and filling the remaining portion of the first opening 110", and performing a planarization process to remove excess portion of the conductive material over the top surface of the first dielectric layer 105. In some embodiments, the planarization process for forming the conductive plug 133 is a chemical mechanical polishing (CMP) process.

Figure 13:
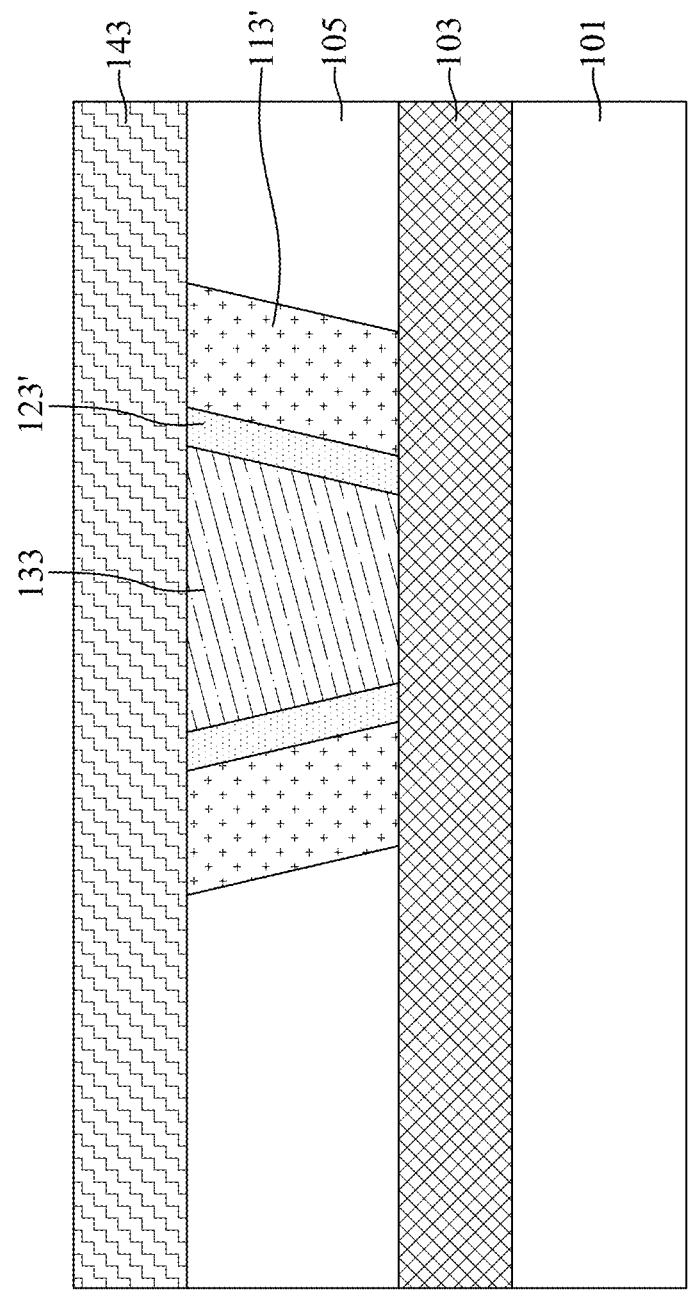
FIG. 13 is a cross-sectional view illustrating an intermediate stage of forming a second conductive layer over the first dielectric layer during the formation of the semiconductor device structure, in accordance with some embodiments.

Next, the second conductive layer 143 is formed over the first dielectric layer 105, as shown in FIG. 13 in accordance with some embodiments. The respective step is illustrated as the step S17 in the method 10 shown in FIG. 5. In some embodiments, the second conductive layer 143 includes copper (Cu). Some processes used to limn the second conductive layer 143 are similar to, or the same as those used to form the first conductive layer 103, and details thereof are not repeated herein. In some embodiments, the energy removable layer 113', the lining layer 123' and the conductive plug 133 are covered by the second conductive layer 143.

In some embodiments, the second conductive layer 143 and the conductive plug 133 are formed by the same material and are formed simultaneously. For example, the excess portion of the conductive material aver the top surface of the first dielectric layer 105 is not removed by the planarizing process, and the portion of the conductive material over the top surface of the first dielectric layer 105 forms the second conductive layer 143 without performing additional deposition process.

Figure 14:
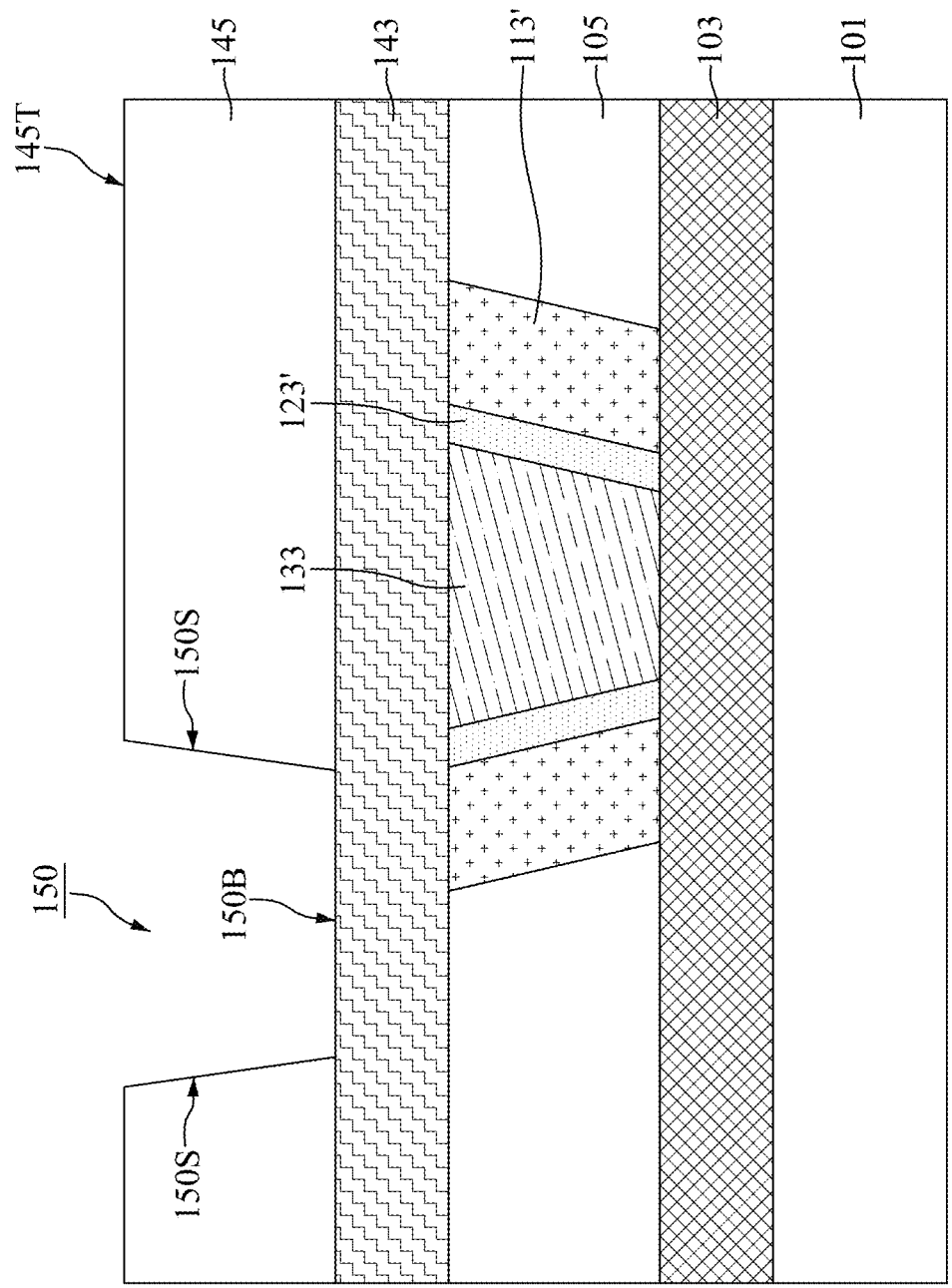
FIG. 14 is a cross-sectional view illustrating an intermediate stage of forming a second dielectric layer with an opening exposing the second conductive layer during the formation of the semiconductor device structure, in accordance with some embodiments.

Subsequently, the second dielectric layer 145 is formed over the second conductive layer 143, and an etching process is performed on the second dielectric layer 145 to form a second opening 150 exposing the second conductive layer 143, as shown in FIG. 14 in accordance with some embodiments. The respective step is illustrated as the step S19 in the method 10 shown in FIG. 5. Some materials and processes used to form the second dielectric layer 145 are similar to, or the same as those used to form the first dielectric layer 105, and details thereof are not repeated herein. In addition, the second opening 150 may be formed by using a patterned mask. Some processes used to form the second opening 150 are similar to, or the same as those used to form the first opening 110, and details thereof are not repeated herein.

Figure 15:
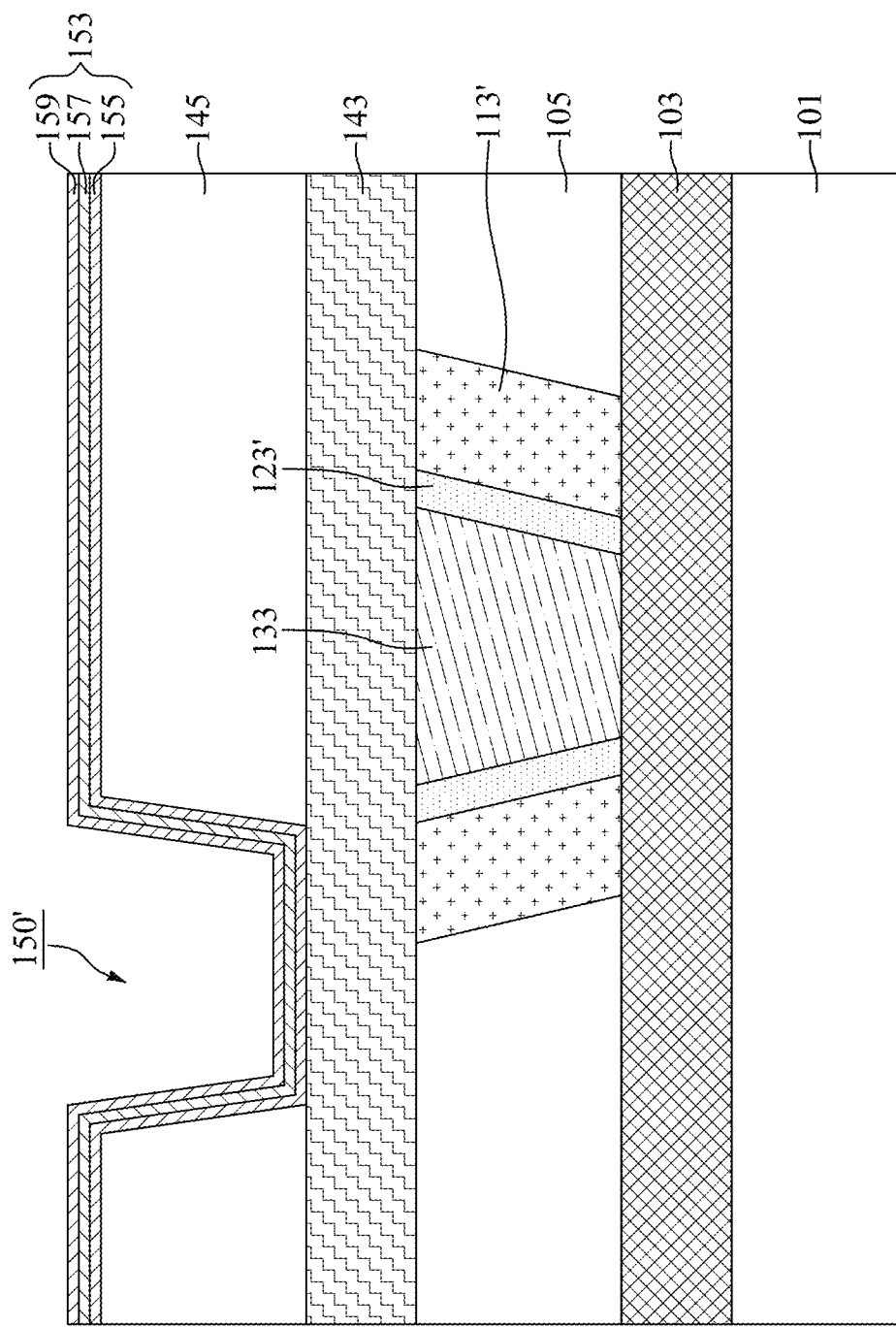
FIG. 15 is a cross-sectional view illustrating an intermediate stage of forming a lining layer over the second dielectric layer during the formation of the semiconductor device structure, in accordance with some embodiments.

After the second opening 150 is formed, the lining layer 153 is formed over the second dielectric layer 145, as shown in FIG. 15 in accordance with some embodiments. In some embodiments, the second opening 150 is lined by the lining layer 153. Specifically, the top surface 145T of the second dielectric layer 145, the sidewalls 150S and the bottom surface 150B of the second opening 150 (See FIG. 14) are covered by the lining layer 153, in accordance with some embodiments.

In some embodiments, the lining layer 153 is a multi-layer structure, which includes the first sub-lining layer 155, the second sub-lining layer 157 and the third sub-lining layer 159. In some embodiments, the first sub-lining layer 155 includes manganese silicon (MnSi), the second sub-lining layer 157 includes manganese (Mn), and the third sub-lining layer 159 includes copper manganese (CuMn). In some embodiments, the first sub-lining layer 155, the second sub-lining layer 157 and the third sub-lining layer 159 are formed by deposition processes, such as CVD, PVD, ALD, MOCVD, sputtering, plating. After the lining layer 153 is formed, a remaining portion of the second opening 150' surrounded by the lining layer 153 is obtained.

Figure 16:
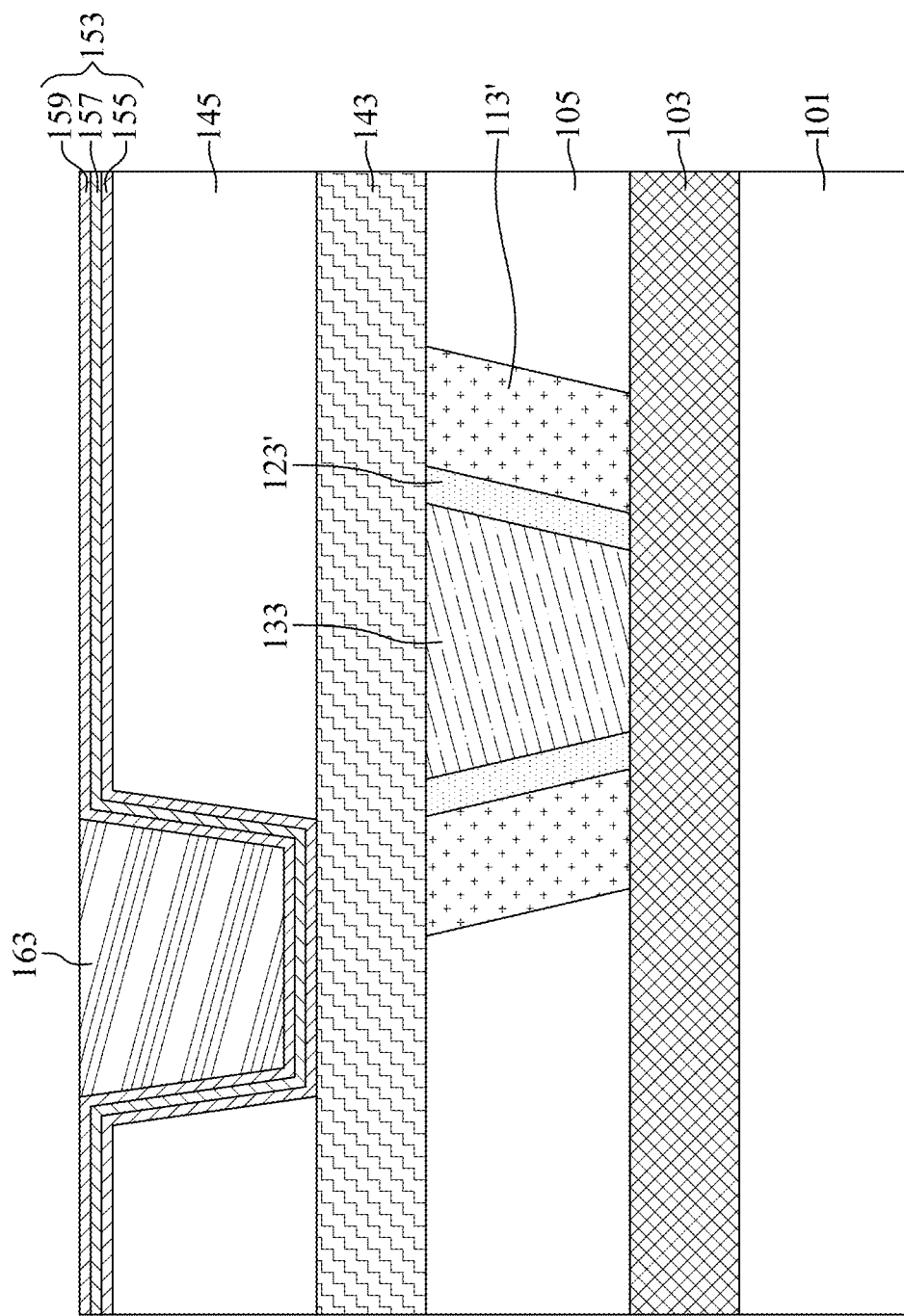
FIG. 16 is a cross-sectional view illustrating an intermediate stage of forming a conductive plug in the second dielectric layer and surrounded by the lining layer during the formation of the semiconductor device structure, in accordance with some embodiments.

Next, the conductive plug 163 is formed in the remaining portion of the second opening 150', as shown in FIG. 16 in accordance with some embodiments. The respective step is illustrated as the step S21 in the method 10 shown in FIG. 5. In some embodiments, the conductive plug 163 is surrounded by the lining layer 153.

In some embodiments, the conductive plug 163 includes copper (Cu). In some embodiments, the conductive plug 163 includes copper (Cu) and tungsten (W). The formation of the conductive plug 163 may include conformally depositing a conductive material (not shown) over the lining layer 153 and filling the remaining portion of the second opening 150', and performing a planarization process to remove excess portion of the conductive material over the top surface of the lining layer 153. In some embodiments, the planarization process for forming the conductive plug 163 is a CMP process.

Figure 17:
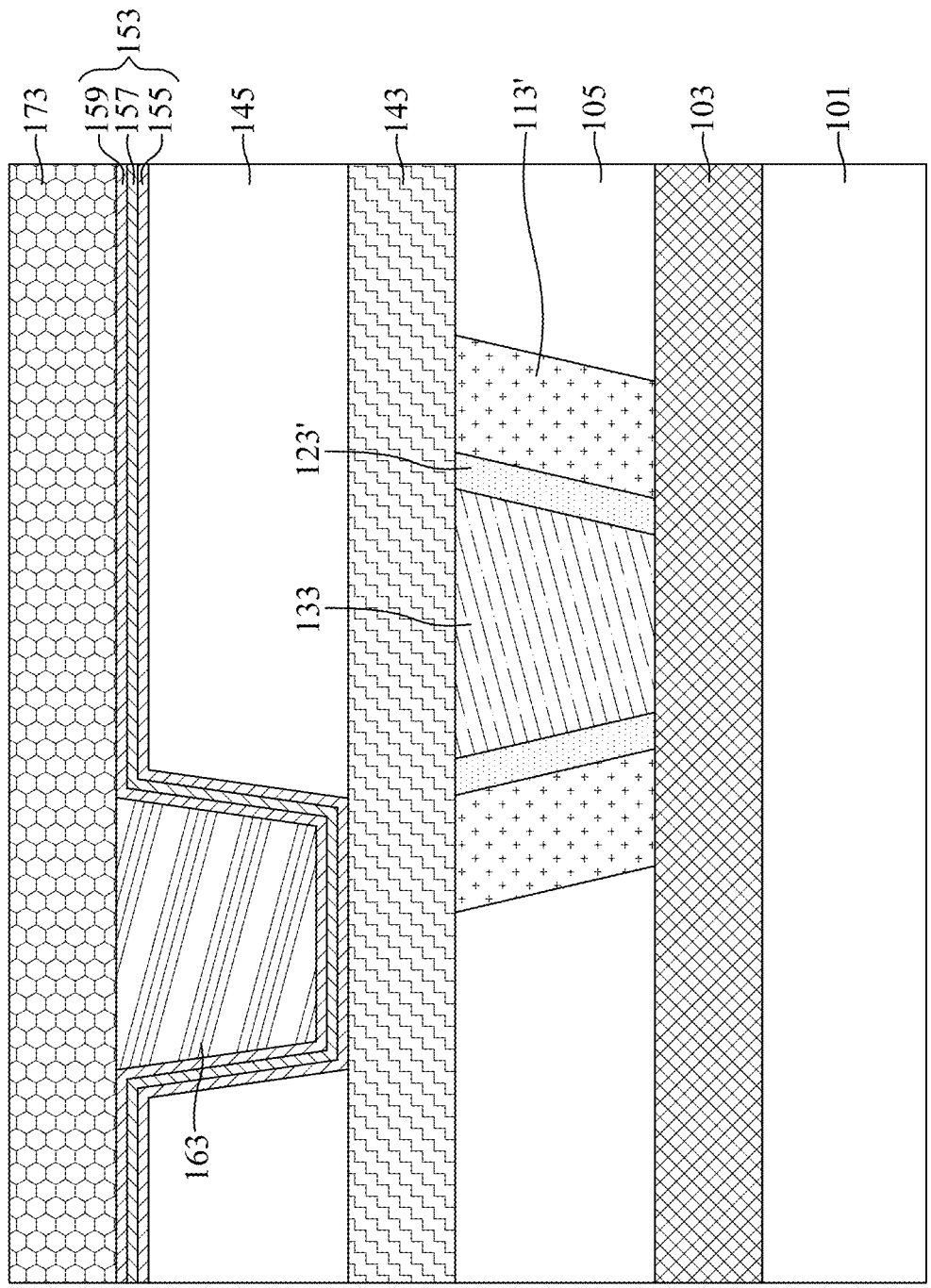
FIG. 17 is a cross-sectional view illustrating an intermediate stage of forming a third conductive layer over the second dielectric layer during the formation of the semiconductor device structure, in accordance with some embodiments.

After the conductive plug 163 is formed, the third conductive layer 173 is formed over the second dielectric layer 145, as shown in FIG. 17 in accordance with some embodiments. The respective step is illustrated as the step S23 in the method 10 shown in FIG. 5. In some embodiments, the third conductive layer 173 includes copper (Cu). Some processes used to form the third conductive layer 173 are similar to, or the same as those used to form the first conductive layer 103, and details thereof are not repeated herein. In some embodiments, the lining layer 153 and the conductive plug 163 are covered by the third conductive layer 173. Similar to the second conductive layer 143 and the conductive plug 133, the third conductive layer 173 and the conductive plug 163 may be formed by the same material and may be formed simultaneously.

Referring back to FIG. 1, a heat treatment process is performed on the structure of FIG. 17 to transform the energy removable layer 113' into the air gap 180. In some embodiments, the air gap 180 is enclosed by the energy removable structure 113", which is the remaining portion of the energy removable layer 113'.

More specifically, the heat treatment process is used to remove the decomposable porogen materials of the energy removable layer 113' to generate pores, and the pores are filled by air after the decomposable porogen materials are removed, such that the air gap 180 is obtained, in accordance with some embodiments. In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable layer 113', such that the air gap 180 is obtained. After the air gap 180 is formed, the semiconductor device 100a is obtained.

Figure 18:
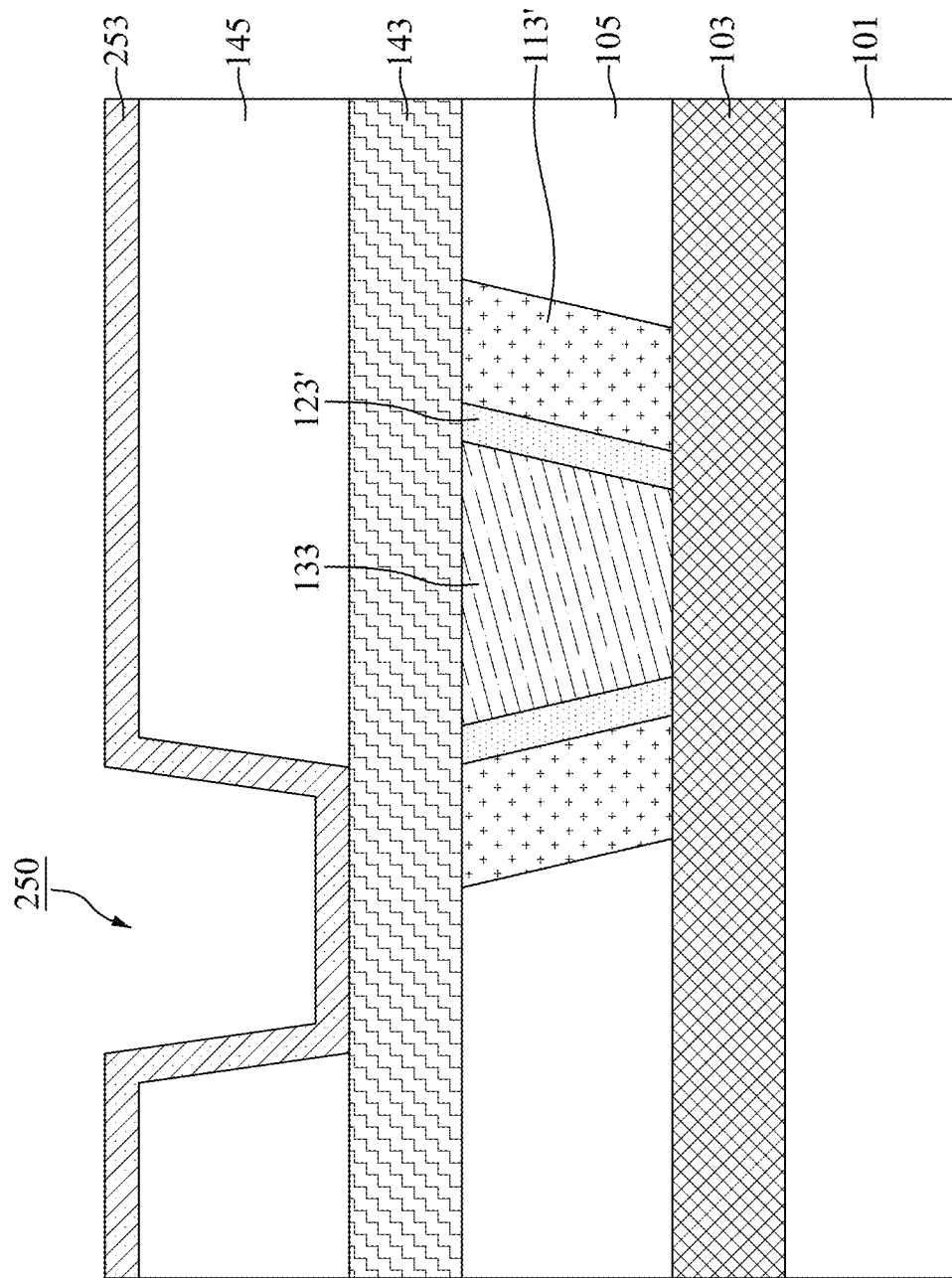
FIG. 18 is a cross-sectional view illustrating an intermediate stage of forming a lining layer over the second dielectric layer during the formation of a modified semiconductor device structure, in accordance with some embodiments.

FIG. 18 is a cross-sectional view illustrating an intermediate stage of forming the lining layer 253 over the second dielectric layer 145 during the formation of the modified semiconductor device structure 200a of FIG. 3, in accordance with some embodiments. After the second opening 150 is formed (i.e., following the step of FIG. 14), the lining layer 253 is formed over the second dielectric layer 145, as shown in FIG. 18 in accordance with some embodiments.

In some embodiments, the lining layer 253 is a single layer covering the top surface 145T of the second dielectric layer 145, the to sidewalls 150S and the bottom surface 150B of the second opening 150 (See FIG. 14). In some embodiments, the lining layer 253 includes copper-manganese-silicon (CuMnSi). After the lining layer 253 is formed, a remaining portion of the second opening 250 surrounded by the lining layer 253 is obtained.

Subsequently, the remaining portion of the second opening 250 is filled by the conductive plug 163, and the third conductive layer 173 is formed to cover the lining layer 253 and the conductive plug 163. After the third conductive layer 173 is formed, a heat treatment process is performed to transform the energy removable layer 113' into the air gap 180. In some embodiments, the air gap 180 is enclosed by the energy removable structure 113", which is the remaining portion of the energy removable layer 113'. After the air gap 180 is formed, the modified semiconductor device 200a of FIG. 3 is obtained.

Figure 19:
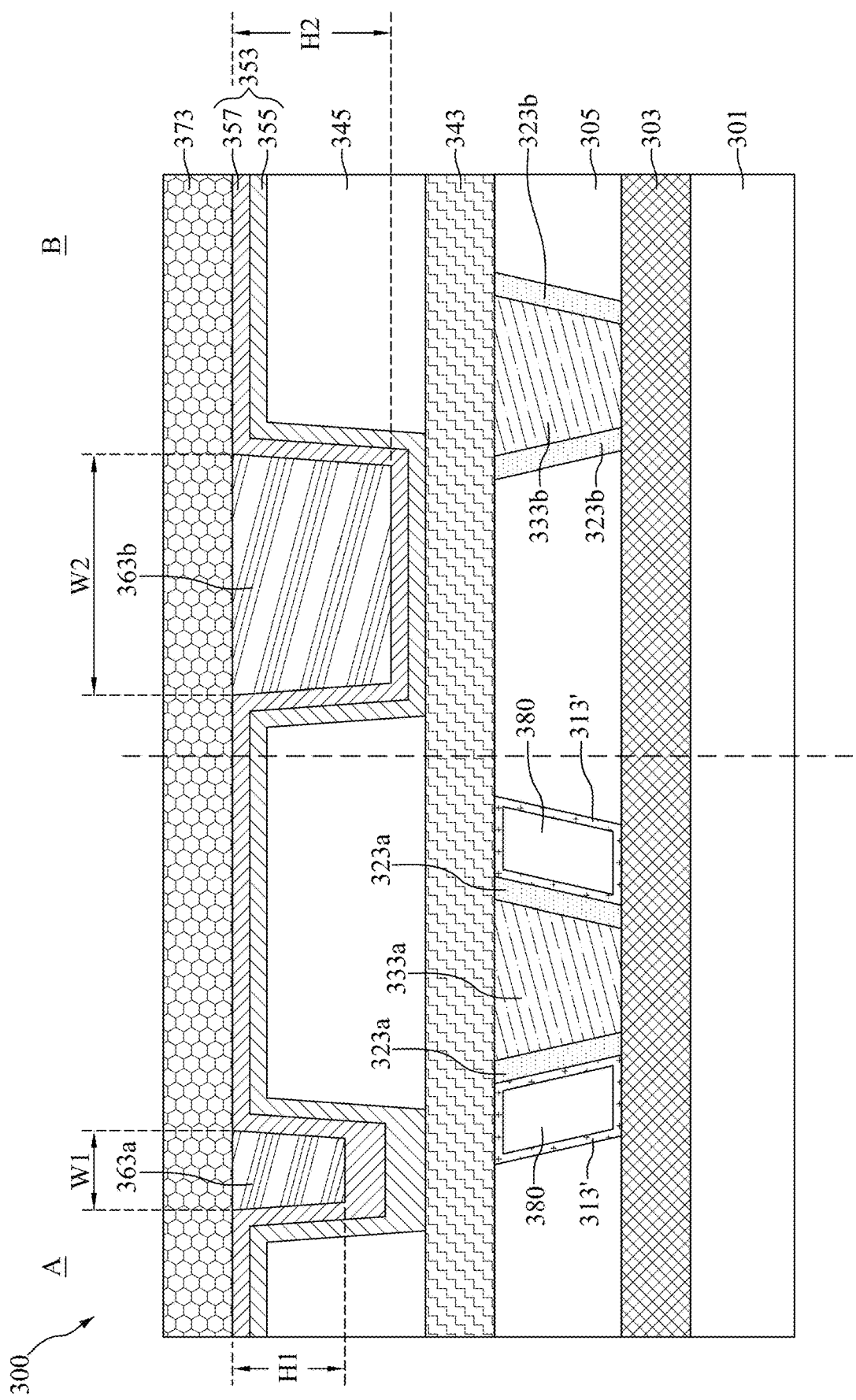
FIG. 19 is a cross-sectional view illustrating a semiconductor device structure having a pattern-dense region and a pattern-loose region, in accordance with some embodiments.

FIG. 19 is a cross-sectional view illustrating a pattern-dense region A and a pattern-loose region B of a semiconductor device structure 300, in accordance with some embodiments. The semiconductor device structure 300 may be similar to the semiconductor device structure 100a where like reference numerals represent like elements.

The semiconductor device structure 300 includes a first conductive layer 303 disposed over a semiconductor substrate 301, a first dielectric layer 305 disposed over the first conductive layer 303, a second conductive layer 343 disposed over the first dielectric layer 305, a second dielectric layer 345 disposed over the second conductive layer 343, and a third conductive layer 373 disposed over the second dielectric layer 345. Details regarding this embodiment that are similar to those for the previously described embodiments will not be repeated herein.

In the pattern-dense region A, the semiconductor device structure 300 includes a lining layer 323a (also referred to as a first lining layer) and a conductive plug 333a (also referred to as a first conductive plug) disposed in the first dielectric layer 305, and a lining layer 353 (also referred to as a second lining layer) and a conductive plug 363a (also referred to as a second conductive plug) disposed in the second dielectric layer 345. In some embodiments, the conductive plug 333a is surrounded by the lining layer 323a, and the conductive plug 363a is surrounded by the lining layer 353. Moreover, the semiconductor device structure 300 includes an energy removable structure 313' and an air gap 380 enclosed by the energy removable structure 313' in the pattern-dense region A.

In the pattern-dense region B, the semiconductor device structure 300 includes a lining layer 323b and a conductive plug 333b disposed in the first dielectric layer 305, and a conductive plug 363a (also referred to as a third conductive plug) disposed in the second dielectric layer 345. In some embodiments, the conductive plug 333b is surrounded by the lining layer 323b. It should be noted that the lining layer 353 extends from the pattern-dense region A to the pattern-loose region B, and the conductive plug 363b is surrounded by the lining layer 353.

Specifically, the lining layer 353 is a multi-layered structure, which includes a first sub-lining layer 355 and a second sub-lining layer 357 disposed over the first sub-lining layer 355. In some embodiments, the first sub-lining layer 355 is in direct contact with the second conductive layer 343 and the second dielectric layer 345. In some embodiments, the second sub-lining layer 357 is in direct contact with the conductive plugs 363a and 363b, and the third conductive layer 373.

In some embodiments, the first conductive layer 303, the second conductive layer 343, the third conductive layer 373, and the conductive plugs 333a, 333b, 363a and 363b each include copper (Cu), and the lining layers 323a, 323b and 353 each include manganese (Mn). In some other embodiments, the conductive plugs 333a, 333b, 363a and 363b each further include tungsten (W). In particular, the lining layers 323a and 323b each include copper-manganese-silicon (CuMnSi), the first sub-lining layer 355 of the lining layer 353 includes manganese-rich manganese silicon (MnSi) or manganese (Mn), and the second sub-lining layer 357 of the lining layer 353 includes copper manganese (CuMn), in accordance with some embodiments.

Figure 20:
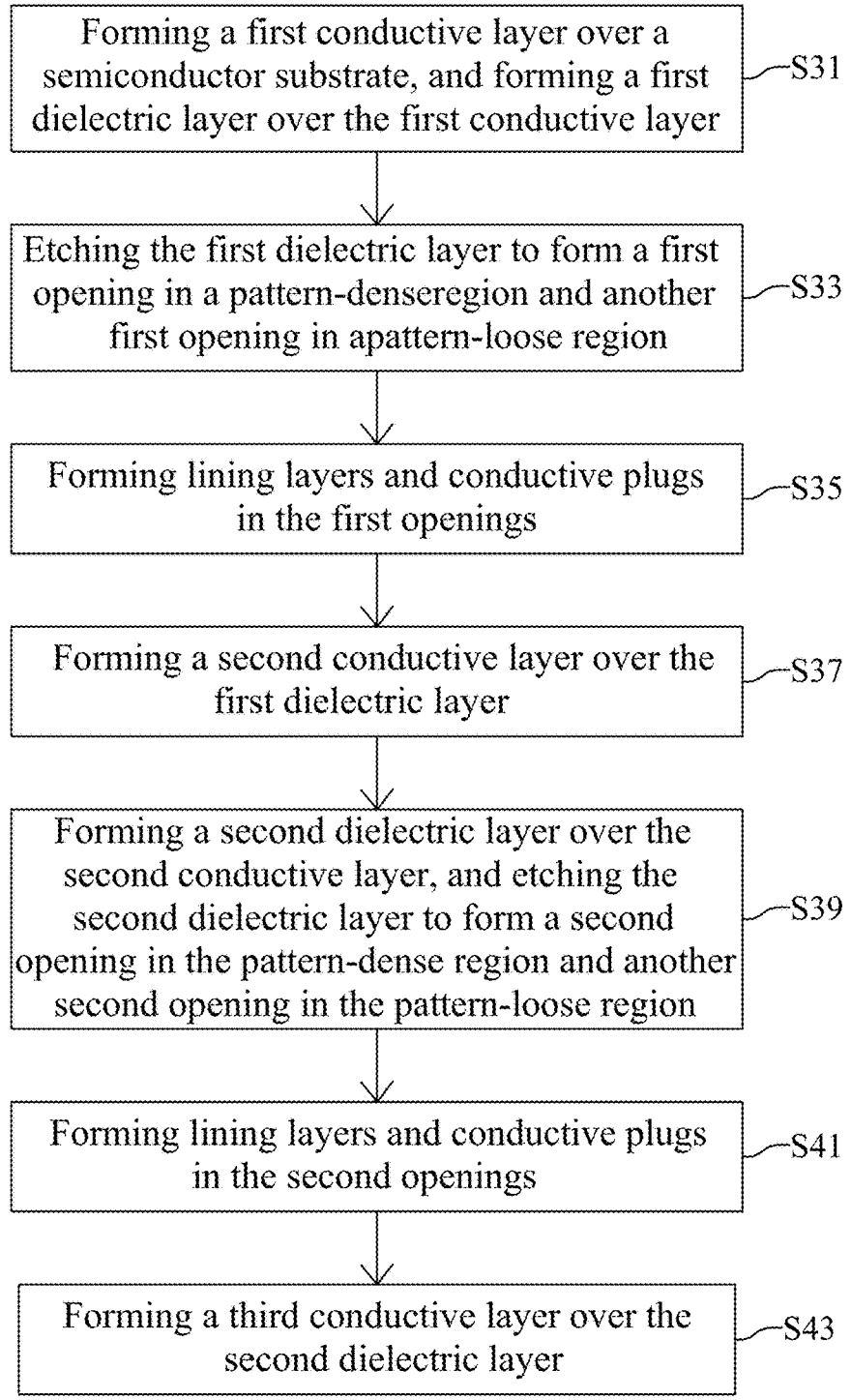
FIG. 20 is a flow diagram illustrating a method for preparing a semiconductor device structure having a pattern-dense region and a pattern-loose region, in accordance with some embodiments.

FIG. 20 is a flow diagram illustrating a method 30 of limning a semiconductor device structure 300, and the method 30 includes steps S31, S33, S35, S37, S39, S41 and S43, in accordance with some embodiments. The steps S31 to S43 of FIG. 20 are elaborated in connection with the following figures.

Figure 21:
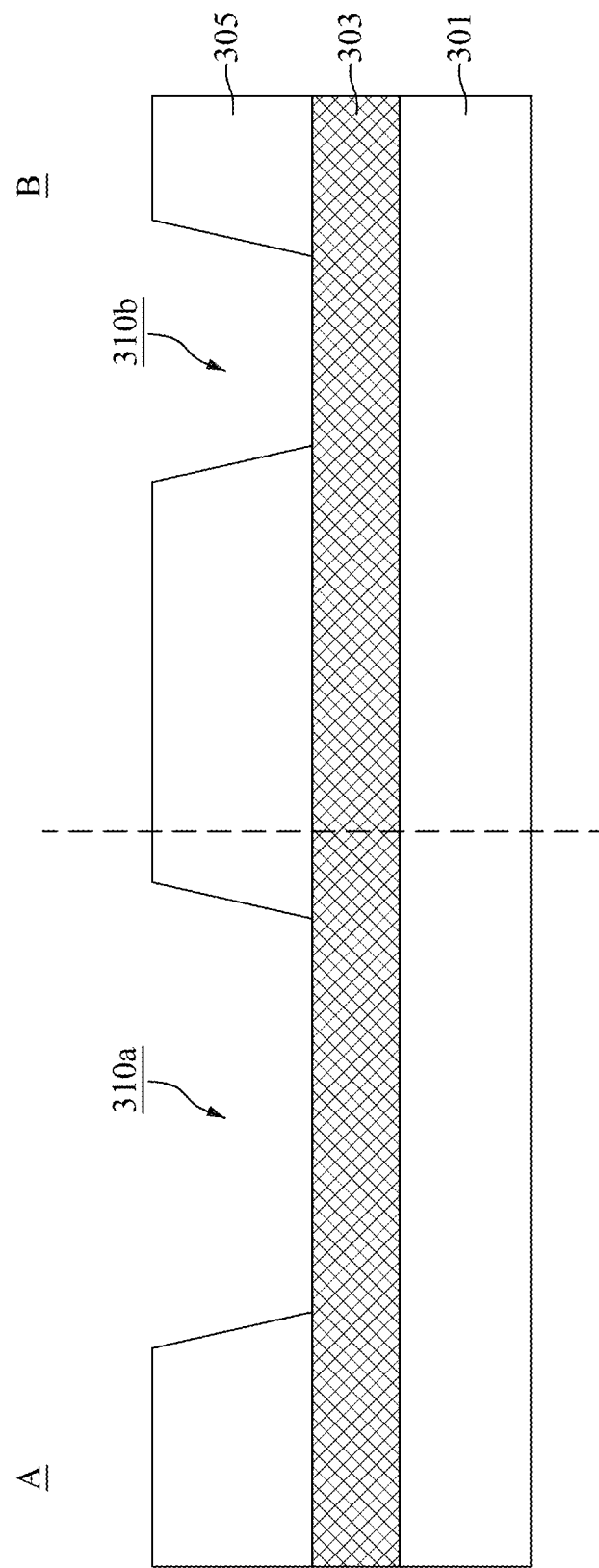
FIG. 21 is a cross-sectional view illustrating an intermediate stage of sequentially forming a first conductive layer and a first dielectric layer with first openings over a semiconductor substrate during the formation of the semiconductor device structure, in accordance with some embodiments.

FIGS. 21 to 27 are cross-sectional views illustrating intermediate stages of forming the semiconductor device structure 300, in accordance with some embodiments. As shown in FIG. 21, the first conductive layer 303 is formed over the semiconductor substrate 301, and the first dielectric layer 305 is formed over the first conductive layer 303. The respective step is illustrated as the step S31 in the method 30 shown in FIG. 20.

Some materials and processes used to form the semiconductor substrate 301 are similar to, or the same as those used to form the semiconductor substrate 101, and details thereof are not be repeated herein. The first conductive layer 303 and the first dielectric layer 305 may be formed by deposition processes, such as CVD, PVD, ALD, sputtering, spin-on coating.

Still referring to FIG. 21, the first dielectric layer 305 is etched to form a first opening 310a in the pattern-dense region A and a first opening 310b in the pattern-loose region B, in accordance with some embodiments. In some embodiments, each of the first openings 310a and 310b exposes a portion of the first conductive layer 303. The respective step is illustrated as the step S33 in the method 30 shown in FIG. 20. The etching process for forming the first Openings 310a and 310b may be wet etching process, dry etching process, or a combination thereof.

Figure 22:
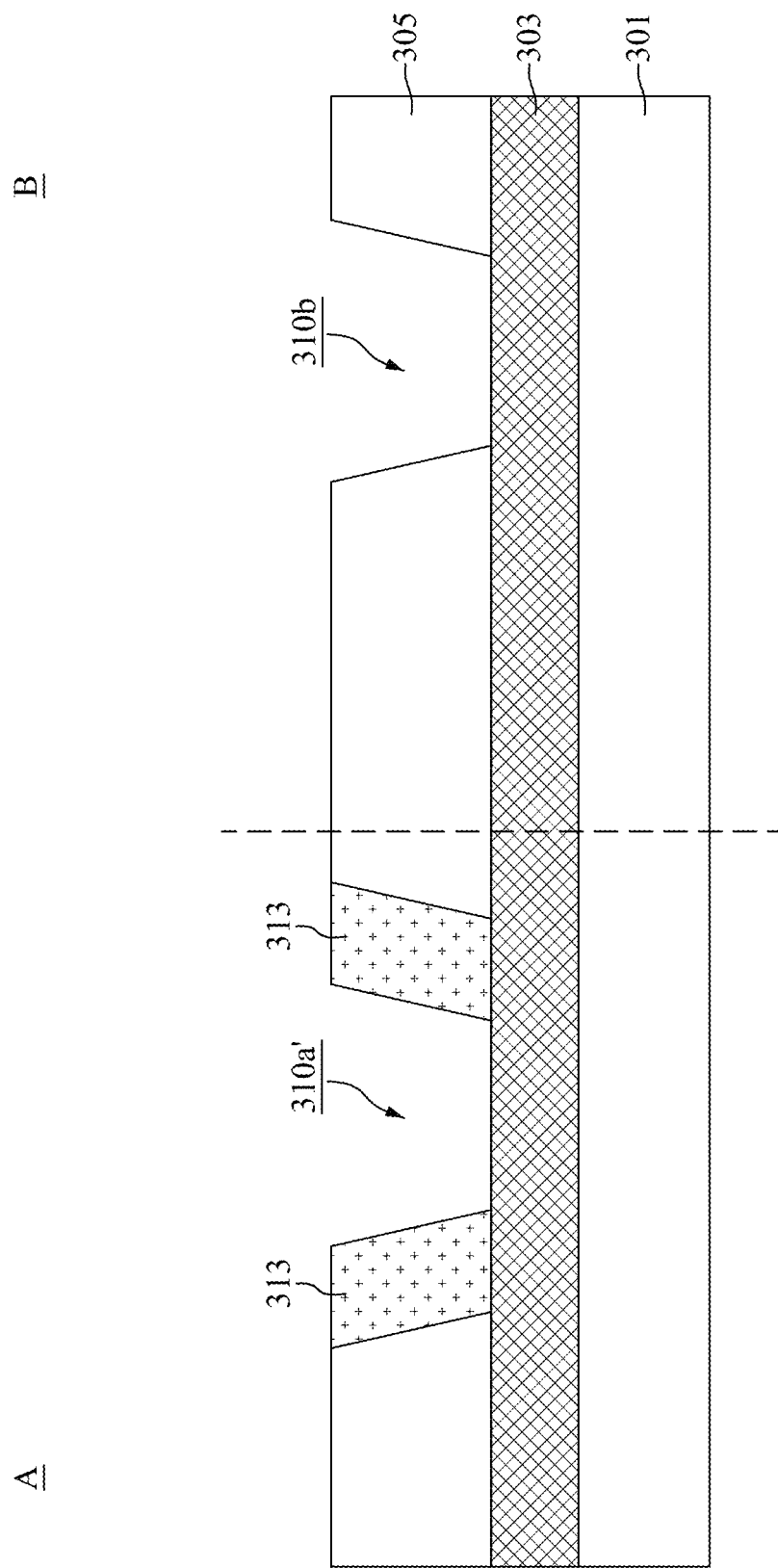
FIG. 22 is a cross-sectional view illustrating an intermediate stage of forming an energy removable layer in the first opening of the pattern-dense region during the formation of the semiconductor device structure, in accordance with some embodiments.

After the first openings 310a and 310b in the first dielectric layer 305 are formed, a patterned mask (not shown) may be formed to cover the structure in the pattern-loose region B, and an energy removable material (not shown) may be conformally deposited over the first dielectric layer 305. Then, an anisotropic etching process may be performed on the energy removable material to remove the same amount of the energy removable material vertically in all places, leaving an energy removable layer 313 on the sidewalls of the first opening 310a in the pattern-dense region A, as shown in FIG. 22 in accordance with some embodiments.

After the energy removable layer 313 is formed, a remaining portion of the first opening 310a' is surrounded by the energy removable layer 313. Some materials used to form the energy removable layer 313 may be similar to, or the same as those used to form the energy removable layer 113' (See FIG. 9), and details thereof are not repeated herein. Moreover, the patterned mask used to protect the first opening 310b in the pattern-loose region B may be removed after the anisotropic etching process for forming the energy removable layer 313 is performed.

Figure 23:
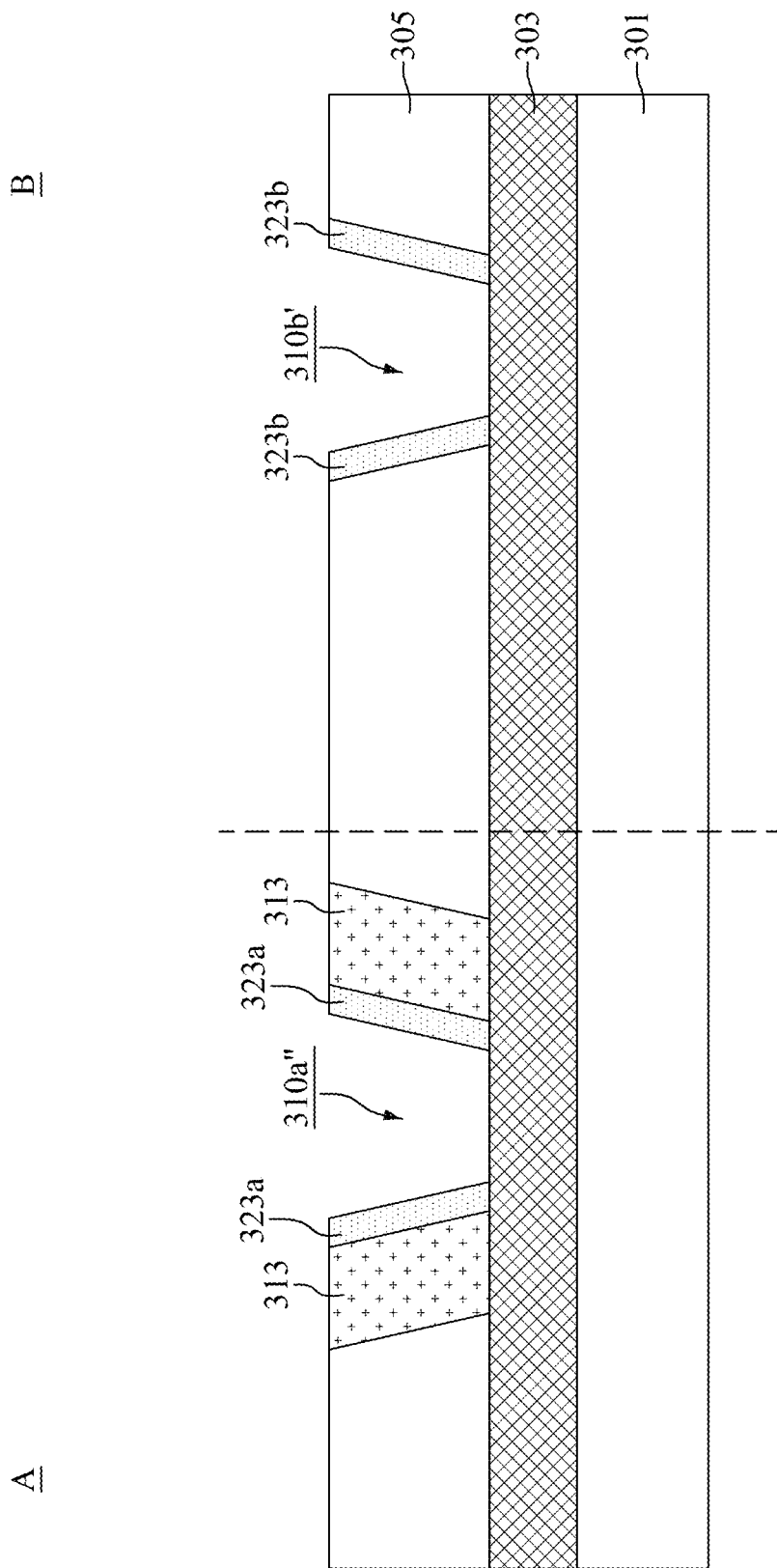
FIG. 23 is a cross-sectional view illustrating an intermediate stage of forming lining layers in the first openings during the formation of the semiconductor device structure, in accordance with some embodiments.

Next, the lining layer 323a is formed in the remaining portion of the first opening 310a', and the lining layer 323b is formed in the first opening 310b, as shown in FIG. 23 in accordance with some embodiments. The lining layers 323a and 323b may be formed simultaneously.

In some embodiments, the formation of the lining layers 323a and 323b includes conformally depositing a lining material (not shown) over the first dielectric layer 305 and covering the sidewalls and the bottom surfaces of the openings 310a' and 310b, and performing are anisotropic etching process to remove the same amount of the lining material vertically in all places, leaving the lining layer 323a on the sidewalls of the energy removable layer 313 in the pattern-dense region A and the lining layer 323b on the sidewalls of the first opening 310b in the pattern-loose region B. After the anisotropic etching process is performed, a remaining portion of the first opening 310a" is surrounded by the lining layer 323a, and a remaining portion of the first opening 310b' is surrounded by the lining layer 323b.

Figure 24:
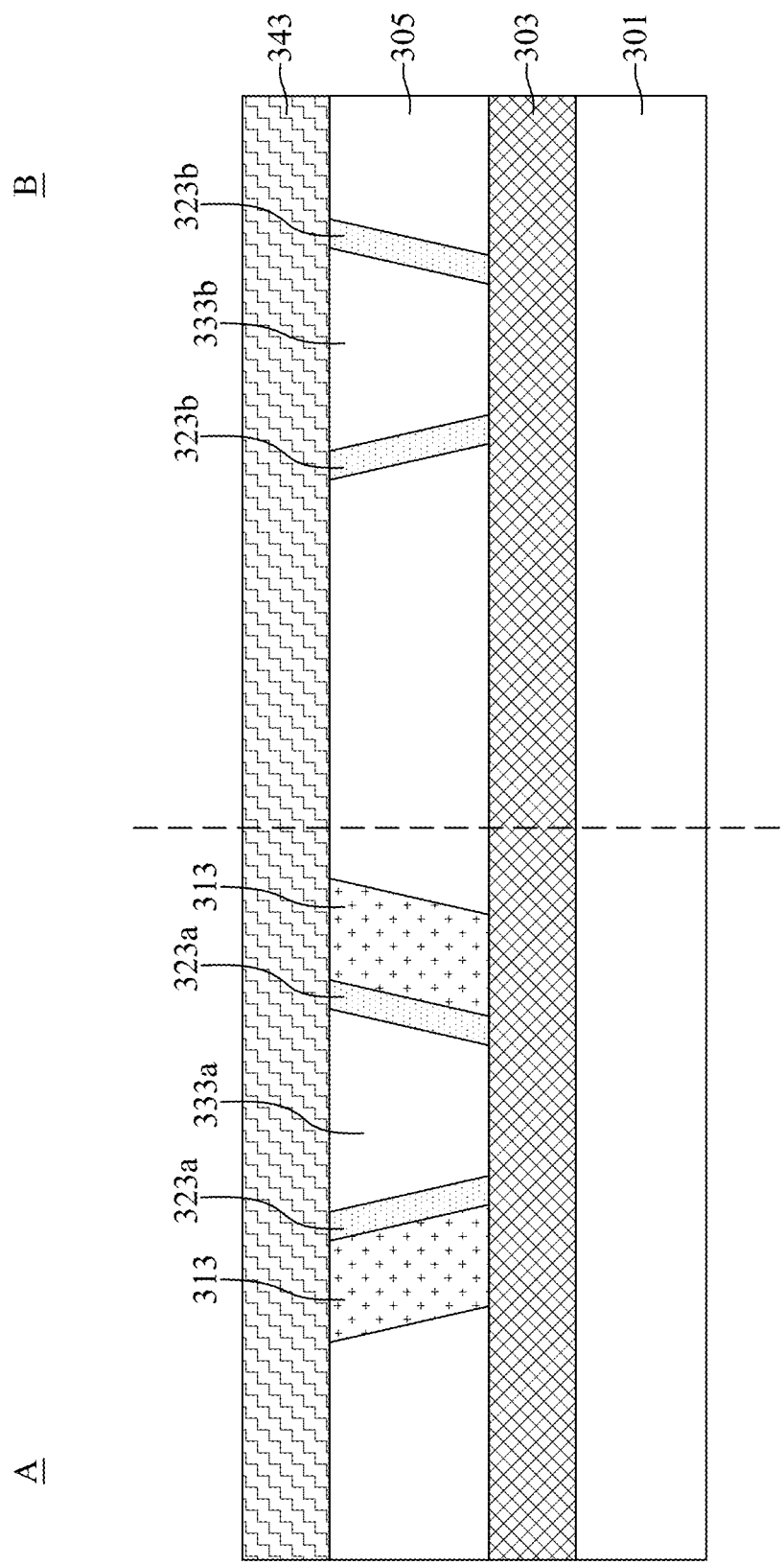
FIG. 24 is a cross-sectional view illustrating an intermediate stage of forming conductive plugs in the first openings and forming a second conductive layer over the first dielectric layer during the formation of the semiconductor device structure, in accordance with some embodiments.

After the lining layers 323a and 323b are formed, the conductive plug 333a is formed in the pattern-dense region A and the conductive plug 333b is formed in the pattern-loose region B, as shown in FIG. 24 in accordance with some embodiments. In some embodiments, the remaining portions of the first opening 310a" are filled by the conductive plug 333a, and the remaining portion of the first opening 310b' is filled by the conductive plug 333b. The respective step is illustrated as the step S35 in the method 30 shown in FIG. 20.

The conductive plugs 333a and 333b may be formed simultaneously. In some embodiments, the formation of the conductive plugs 333a and 333b includes a deposition process and a subsequent planarization process. It should be noted that the lining layer 323b and the conductive plug 333b in the pattern-loose region B are not surrounded by any energy removable layer, in accordance with some embodiments.

Next, still referring to FIG. 24, the second conductive layer 343 is formed over the first dielectric layer 305, in accordance with some embodiments. The respective step is illustrated as the step S37 in the method 30 shown in FIG. 20. Some materials and processes used to form the second conductive layer 343 are similar to, or the same as those used to form the first conductive layer 303, and details thereof are not repeated herein.

Figure 25:
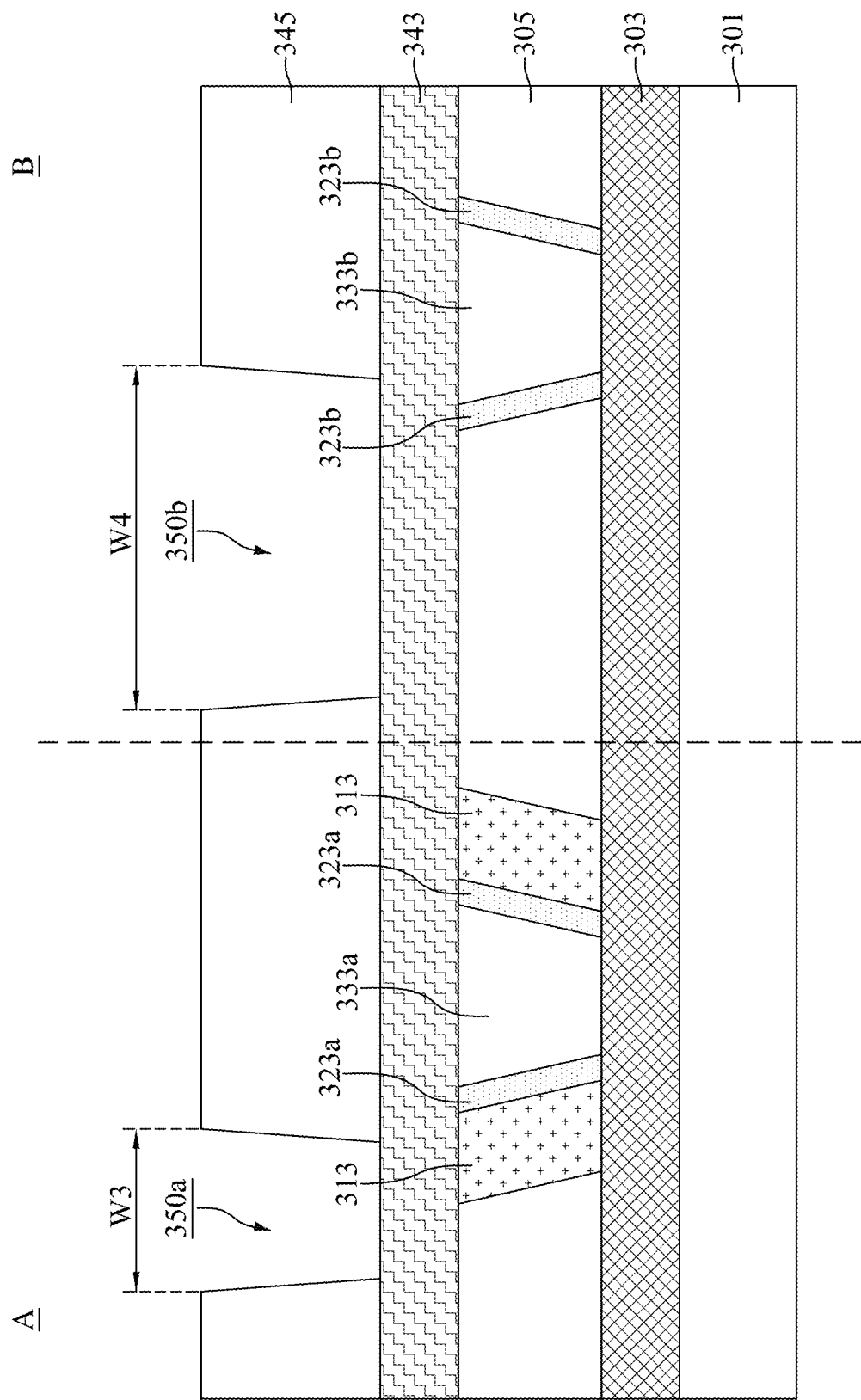
FIG. 25 is a cross-sectional view illustrating an intermediate stage of forming a second dielectric layer with second openings over the second conductive layer during the formation of the semiconductor device structure, in accordance with some embodiments.

Subsequently, the second dielectric layer 345 is formed over the second conductive layer 343, and the second dielectric layer 345 is etched to form a second opening 350a in the pattern-dense region A and a second opening 350b in the pattern-loose region B, as shown in FIG. 25 in accordance with some embodiments. In some embodiments, each of the second openings 350a and 350b exposes a portion of the second conductive layer 343. The respective step is illustrated as the step S39 in the method 30 shown in FIG. 20.

Some materials and processes used to form the second dielectric layer 345 are similar to, or the same as those used to form the first dielectric layer 305, and details thereof are not repeated herein. In addition, the etching process for forming the second openings 350a and 350b may be wet etching process, dry etching process, or a combination thereof. As shown in FIG. 25, the second opening 350a in the pattern-dense region A has a width W3, and the second opening 350b in the pattern-loose region B has a width W4. It should be noted that the width W4 is greater than the width W3 in accordance with some embodiments.

Figure 26:
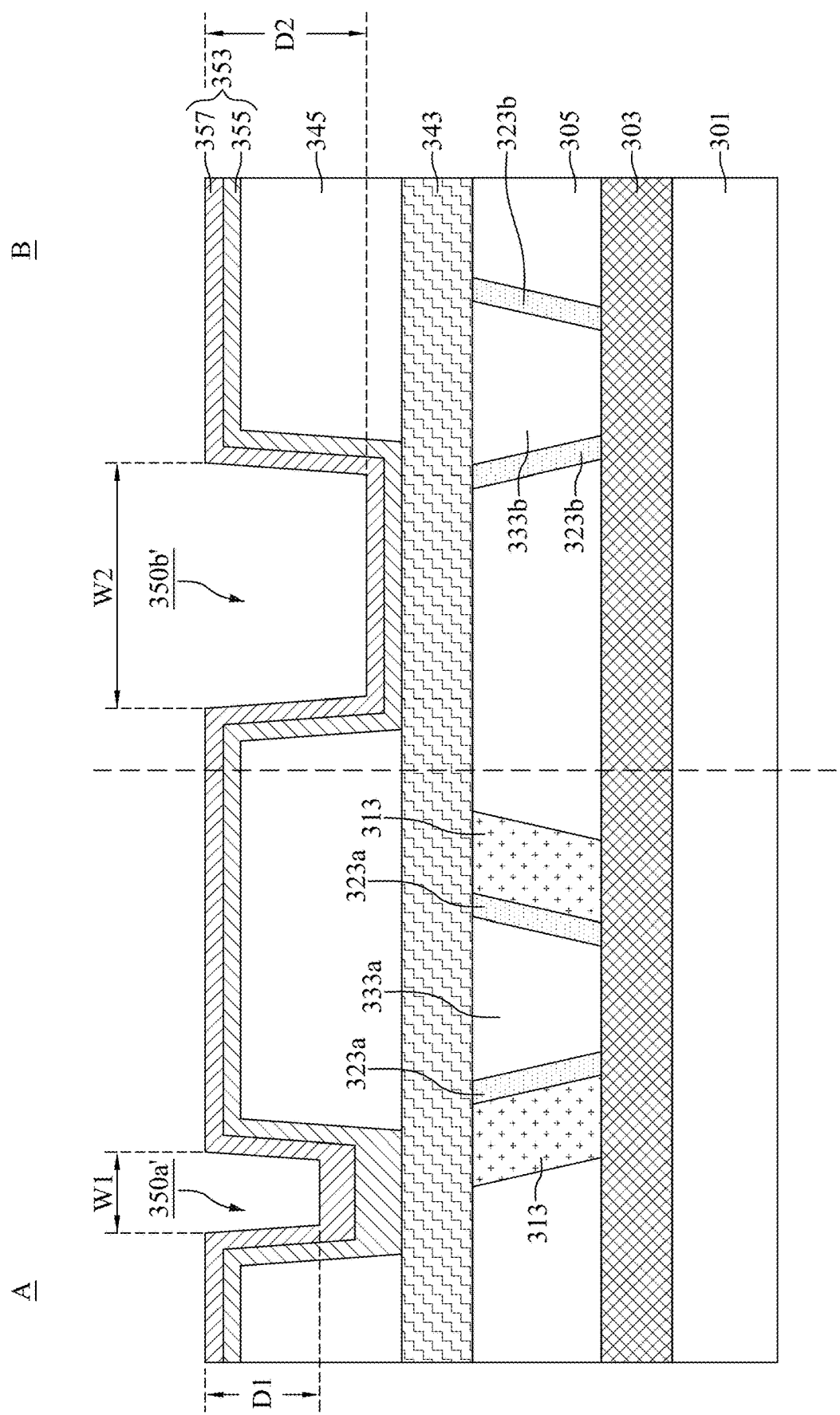
FIG. 26 is a cross-sectional view illustrating an intermediate stage of forming lining layers in the second openings during the formation of the semiconductor device structure, in accordance with some embodiments.

After the second openings 350a and 350b are formed, the first sub-lining layer 355 of the lining layer 353 is conformally deposited over the second dielectric layer 345 and covering the sidewalls and the bottom surfaces of the second openings 350a and 350b, and the second sub-lining layer 357 of the lining layer 353 is conformally deposited over the first sub-lining layer 355, as shown in FIG. 26 in accordance with some embodiments. The first sub-lining layer 355 and the second sub-lining layer 357 of the lining layer 353 are formed by deposition processes, such as CVD, PVD, ALD, MOCVD, sputtering, plating. After the lining layer 353 is formed, a remaining portion of the second opening 350a' in the pattern-dense region A and a remaining portion of the second opening 350b' in the pattern-loose region B are surrounded by the lining layer 353.

As shown in FIG. 26, the width W2 of the remaining portion of the second opening 350b' is greater than the width W1 of the remaining portion of the second opening 350a', in accordance with some embodiments. Moreover, the depth H2 of the remaining portion of the second opening 350b' is greater than the depth D1 of the remaining portion of the second opening 350a', in accordance with some embodiments.

Figure 27:
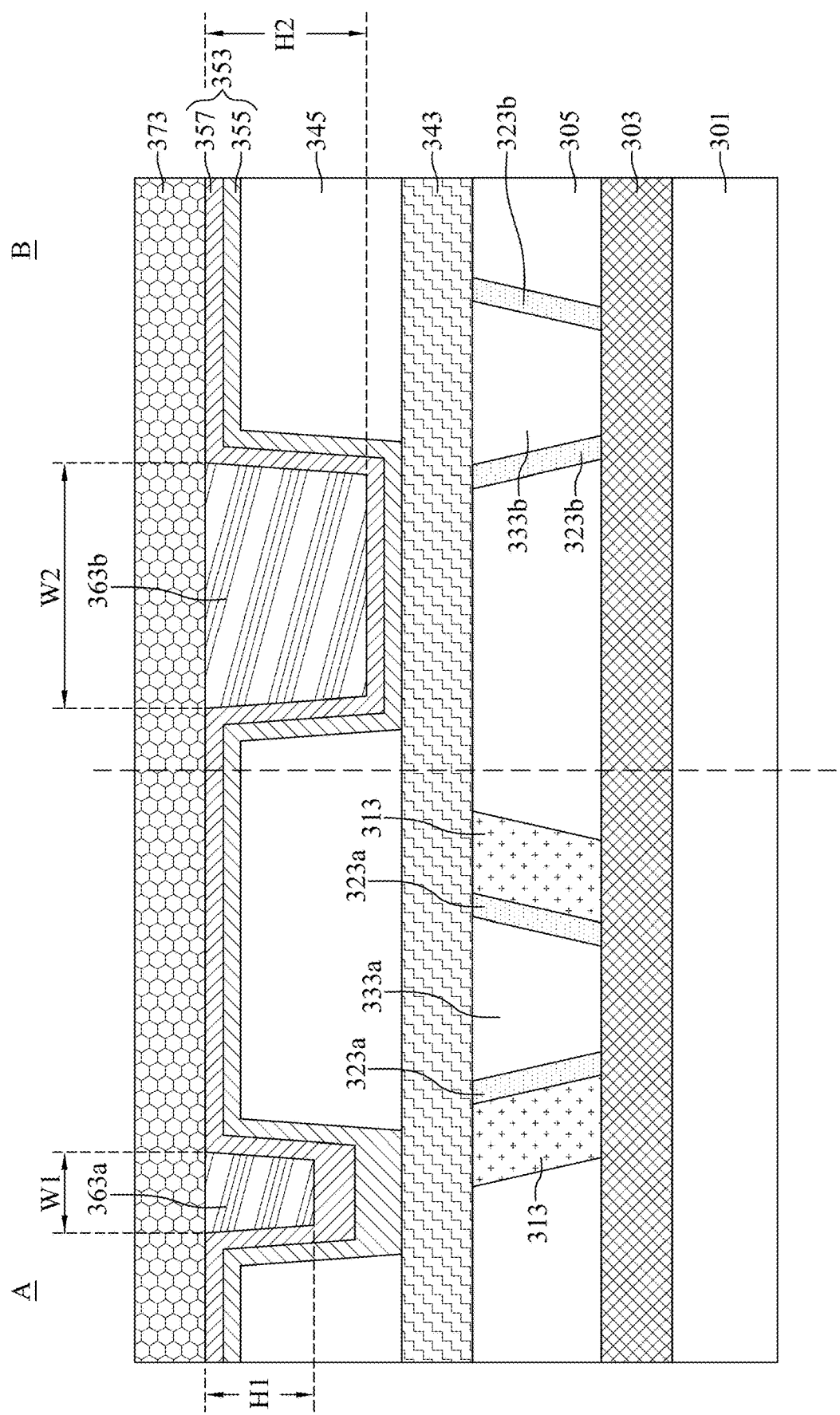
FIG. 27 is a cross-sectional view illustrating an intermediate stage of forming conductive plugs in the second openings and forming a third conductive layer over the second dielectric layer during the formation of the semiconductor device structure, in accordance with some embodiments.

Next, the conductive plug 363a is formed in the pattern-dense region A, and the conductive plug 363b is formed in the pattern-loose region B, as shown in FIG. 27 in accordance with some embodiments. In some embodiments, the remaining portion of the second opening 350a' is filled by the conductive plug 363a, and the remaining portion of the second opening 350b' is filled by the conductive plug 363b. The respective step is illustrated as the step S41 in the method 30 shown in FIG. 20.

The conductive plugs 363a and 363b may be formed simultaneously. Similar to the conductive plugs 333a and 333b, the formation of the conductive plugs 363a and 363b may include a deposition process and a subsequent planarization process.

Still referring to FIG. 27, the third conductive layer 373 is formed over the second dielectric layer 345. In some embodiments, the lining layer 353, and the conductive plugs 363a and 363b are covered by the third conductive layer 373. Some processes used to forth the third conductive layer 373 are similar to, or the same as those used to form the first conductive layer 303, and details thereof are not repeated herein. The respective step is illustrated as the step S43 in the method 30 shown in FIG. 20.

In some embodiments, the second opening 350b in the pattern-loose region B is wider than the second opening 350a in the pattern-dense region A (See FIG. 25, the width W4 is greater than the width W3). Therefore, after the lining layer 353 is formed, the depth D2 of the remaining portion of the second opening 350b' in the pattern-loose region B is greater than the depth D1 of the remaining portion of the second opening 350a' in the pattern-dense region A (See FIG. 26). As a result, the width W2 of the conductive plug 363b in the pattern-loose region B is greater than the width W1 of the conductive plug 363a in the pattern-dense region A, and the height H2 of the conductive plug 363b in the pattern-loose region B is greater than the height H1 of the conductive plug 363a in the pattern-dense region A, as shown in FIG. 27 in accordance with some embodiments.

A heat treatment process is performed to transform the energy removable layer 313 into the air gap 380. In some other embodiments, the heat treatment process can be replaced by a light treatment process, an e-beam treatment process, a combination thereof, or another applicable energy treatment process. In some embodiments, the air gap 380 is enclosed by the energy removable structure 313', which is the remaining portion of the energy removable layer 313. After the air gap 380 is formed, the semiconductor device structure 300 is obtained. It should be noted that the lining layer 323b and the conductive plug 333b in the pattern-loose region B are not surrounded by any air gap, in accordance with some embodiments.

Figure 28:
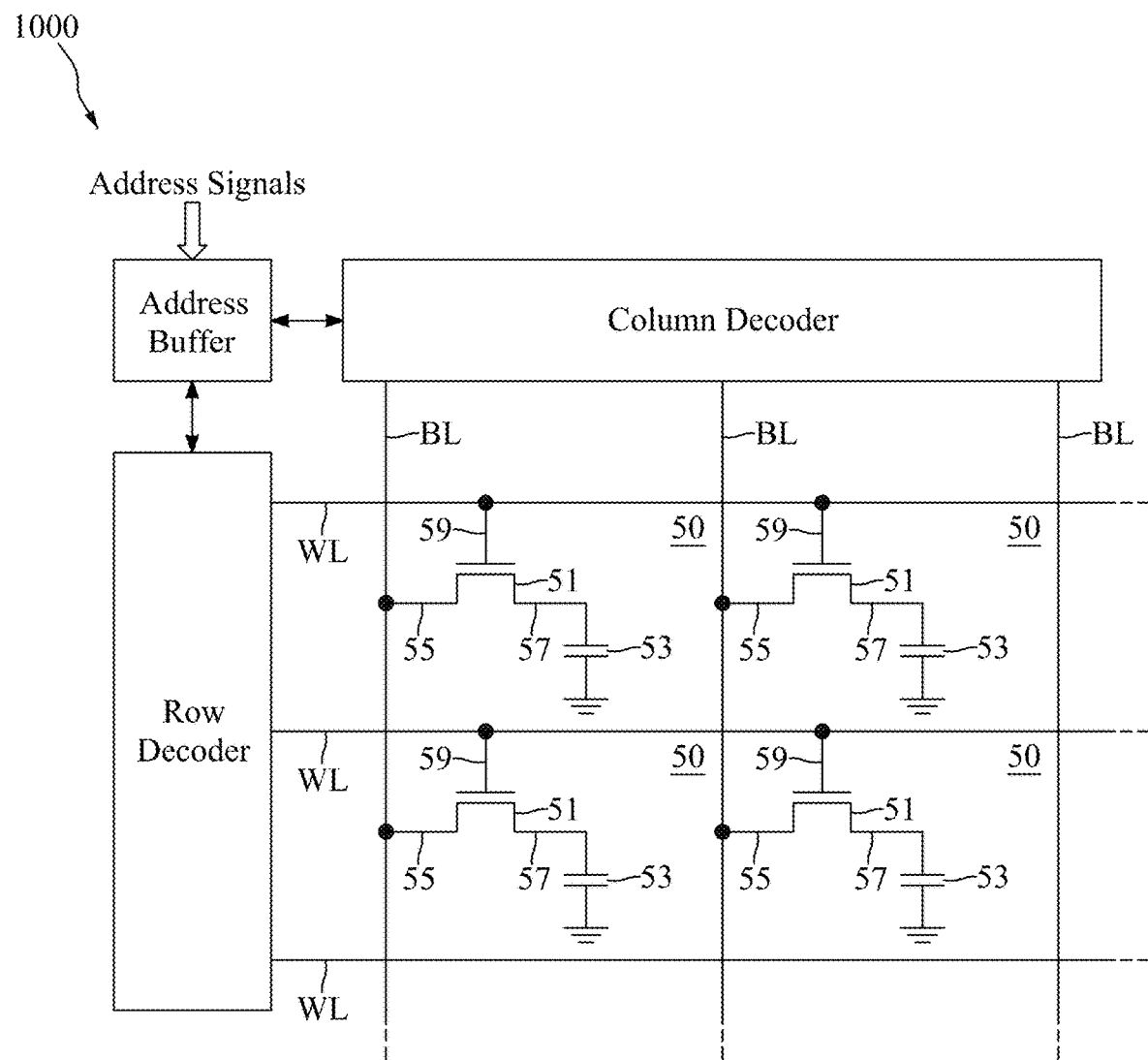
FIG. 28 is a partial schematic illustration of an exemplary integrated circuit, including an array of memory cells in accordance with some embodiments.

FIG. 28 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically, connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 19, the air gap 380 is formed in the pattern-dense region A of the semiconductor device structure 300, while no air gap is formed in the pattern-loose region B of the semiconductor device structure 300. Moreover, the conductive plug 363a having smaller width W1 and smaller height H1 is formed in the pattern-dense region A, while the conductive plug 363b having greater width W2 and greater height H2 is formed in the pattern-loose region B. The pattern-dense region A may be any of the regions of the memory cells 50 in the memory device 1000, and the pattern-loose region B may be any of the regions of the address buffer, the row decoder, or the column decoder in the memory device 1000.

Embodiments of the semiconductor device structures 100a, to 100b, 200a, 200b and 300 are provided in the disclosure. In some embodiments, the semiconductor device structures 100a, 100b, 200a, 200b and 300 each includes a conductive plug disposed between and electrically connecting two conductive layers in the vertical direction, and a lining layer surrounding the conductive plug. The conductive plug includes copper, and the lining layer includes manganese. The manganese-containing lining layer is configured to reduce or prevent voids from forming in the conductive plug, thereby decreasing the contact resistance of the conductive plug. As a result, the operation speed of the semiconductor device structures 100a, 100b, 200a, 200b and 300 may be increased, which significantly improves the overall device performance.

In one embodiment of the present disclosure, a semiconductor device structure is provided. The semiconductor device structure includes a first conductive layer disposed over a semiconductor substrate, and a second conductive layer disposed over the first conductive layer. The semiconductor device structure also includes a first conductive plug disposed between and electrically connecting the first conductive layer and the second conductive layer. The first conductive plug includes copper. The semiconductor device structure further includes a first lining layer surrounding the first conductive plug. The first lining layer includes manganese.

In another embodiment of the present disclosure, a semiconductor device structure is provided. The semiconductor device structure includes a first conductive layer disposed over a semiconductor substrate, and a first dielectric layer disposed over the first conductive layer. The semiconductor device structure also includes a second conductive layer disposed over the first dielectric layer, a second dielectric layer disposed over the second conductive layer, and a third conductive layer disposed over the second dielectric layer. The semiconductor device structure further includes a first conductive plug penetrating through the first dielectric layer and electrically connecting the first conductive layer to the second conductive layer, and a first lining layer disposed between the first conductive plug and the first dielectric layer. The first conductive plug includes copper, and the first lining layer includes manganese. In addition, the semiconductor device structure includes a second conductive plug disposed in the second dielectric layer, and a second lining layer disposed between the second conductive plug and the second dielectric layer. The second conductive plug electrically connects the second conductive layer to the third conductive layer. The second conductive plug includes copper, and the second conductive plug includes copper.

In yet another embodiment of the present disclosure, a method for preparing a semiconductor device structure is provided. The method includes forming a first conductive layer over a semiconductor substrate, and forming a first dielectric layer over the first conductive layer. The first conductive layer includes copper. The method also includes etching the first dielectric layer to form a first opening exposing the first conductive layer, and forming a first lining layer and a first conductive plug in the first opening. The first lining layer includes manganese, the first conductive plug includes copper, and the first conductive plug is surrounded by the first lining layer. The method further includes forming a second conductive layer over the first dielectric layer, the first lining layer and the first conductive layer. The second conductive layer includes copper.

The embodiments of the present disclosure have some advantageous features. By forming the manganese-containing lining layer, the resistance of the conductive plug surrounded by the manganese-containing lining layer may be decreased. As a result, the operation speed of the semiconductor device structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
    a first conductive layer disposed over a semiconductor substrate;
    a second conductive layer disposed over the first conductive layer;
    a first conductive plug disposed between and electrically connecting the first conductive layer and the second conductive layer, wherein the first conductive plug comprises copper (Cu);
    a first lining layer surrounding the first conductive plug, wherein the first lining layer comprises manganese (Mn); and
    a first dielectric layer surrounding the first lining layer, and an air gap between the first lining layer and the first dielectric layer.

2. The semiconductor device structure of claim 1, wherein the first conductive layer and the second conductive layer each comprise copper (Cu), and the first conductive plug further comprises tungsten (W).

3. The semiconductor device structure of claim 1, wherein the first lining layer comprises copper-manganese-silicon (CuMnSi).

4. The semiconductor device structure of claim 1, further comprising:
    a third conductive layer disposed over the second conductive layer;
    a second conductive plug disposed between and electrically connecting the second conductive layer and the third conductive layer, wherein the second conductive plug comprises copper (Cu); and
    a second lining layer surrounding the second conductive plug, wherein a portion of the second lining layer is sandwiched between the second conductive plug and the second conductive layer, and wherein the second lining layer comprises manganese (Mn).

5. The semiconductor device structure of claim 4, wherein the second lining layer comprises:
    a first sub-lining layer disposed over and directly contacting the second conductive layer, wherein the first sub-lining layer comprises manganese silicon (MnSi);
    a second sub-lining layer disposed over the first sub-lining layer, wherein the second sub-lining layer comprises manganese (Mn); and
    a third sub-lining layer disposed over the second sub-lining layer, wherein the third sub-lining layer is in direct contact with the second conductive plug, and wherein the third sub-lining layer comprises copper manganese (CuMn).

6. The semiconductor device structure of claim 4, wherein the second lining layer comprises copper-manganese-silicon (CuMnSi).

7. A semiconductor device structure, comprising:
    a first conductive layer disposed over a semiconductor substrate;
    a first dielectric layer disposed over the first conductive layer;
    a second conductive layer disposed over the first dielectric layer;
    a second dielectric layer disposed over the second conductive layer;
    a third conductive layer disposed over the second dielectric layer;
    a first conductive plug penetrating through the first dielectric layer and electrically connecting the first conductive layer to the second conductive layer, wherein the first conductive plug comprises copper (Cu);
    a first lining layer disposed between the first conductive plug and the first dielectric layer, wherein the first lining layer comprises manganese (Mn);
    a second conductive plug disposed in the second dielectric layer, wherein the second conductive plug electrically connects the second conductive layer to the third conductive layer, and wherein the second conductive plug comprises copper (Cu); and
    a second lining layer disposed between the second conductive plug and the second dielectric layer, wherein the second lining layer comprises manganese (Mn);

wherein the first conductive plug and the second conductive plug are disposed in a pattern-dense region, and an air gap is disposed between the first lining layer and the first dielectric layer.

8. The semiconductor device structure of claim 7, wherein at least one of the first conductive plug and the second conductive plug further comprises tungsten (W).

9. The semiconductor device structure of claim 7, further comprising:
a third conductive plug disposed in the second dielectric layer and in a pattern-loose region, wherein the third conductive plug electrically connects the second conductive layer to the third conductive layer, and the third conductive plug comprises copper (Cu), and
wherein the third conductive plug is separated from the second dielectric layer by the second lining layer, and a height of the third conductive plug is greater than a height of the second conductive plug.

10. The semiconductor device structure of claim 9, wherein a width of the third conductive plug is greater than a width of the second conductive plug.

11. The semiconductor device structure of claim 9, wherein the second lining layer comprises:
a first sub-lining layer disposed over and directly contacting the second conductive layer, wherein the first sub-lining layer comprises manganese (Mn) or manganese silicon (MnSi); and
a second sub-lining layer disposed over the first sub-lining layer, wherein the second sub-lining layer is in direct contact with the second conductive plug, the third conductive plug and the third conductive layer, wherein the second sub-lining layer comprises copper manganese (CuMn).

* * * * *